US010138730B2

(12) United States Patent
McDaniel, Jr. et al.

(10) Patent No.: US 10,138,730 B2
(45) **Date of Patent: *Nov. 27, 2018**

(54) POSITIVE DISPLACEMENT ROTARY DEVICES WITH UNIFORM TOLERANCES

(71) Applicant: Mallen Research Limited Partnership, Charlottesville, VA (US)

(72) Inventors: David Alton McDaniel, Jr., Charlottesville, VA (US); James W. Newman, Jr., Charlottesville, VA (US)

(73) Assignee: MALLEN RESEARCH LIMITED PARTNERSHIP, Charlottesville, VA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/498,045

(22) Filed: Apr. 26, 2017

(65) Prior Publication Data

US 2017/0226856 A1 Aug. 10, 2017

Related U.S. Application Data

(63) Continuation of application No. 14/595,786, filed on Jan. 13, 2015, now Pat. No. 9,664,048, which is a (Continued)

(51) Int. Cl.

*F03C 2/00* (2006.01)
*F03C 4/00* (2006.01)

(Continued)

(52) U.S. Cl.

CPC ................ *F01C 1/123* (2013.01); *F01C 1/20* (2013.01); *F01C 19/025* (2013.01); *F01C 21/08* (2013.01);

(Continued)

(58) Field of Classification Search

CPC .... F01C 1/20; F01C 1/28; F01C 1/123; F01C 1/14; F01C 19/02; F01C 21/08;

(Continued)

(56) References Cited

U.S. PATENT DOCUMENTS

| | | | |
|---|---|---|---|
| 562,405 | A | 6/1896 | Kryszat |
| 597,793 | A | 1/1898 | Taylor |

(Continued)

FOREIGN PATENT DOCUMENTS

| | | | |
|---|---|---|---|
| DE | 3318519 | A1 | 11/1984 |
| EP | 0137421 | A2 | 4/1985 |
| WO | 00/66886 | A1 | 11/2000 |

OTHER PUBLICATIONS

European Patent Office, International Search Report for International Application PCT/US2013/056083 (counterpart to related U.S. Appl. No. 13/593,279), dated Apr. 17, 2014.

(Continued)

*Primary Examiner* — Theresa Trieu
(74) *Attorney, Agent, or Firm* — Baker Botts L.L.P.

(57) ABSTRACT

A first rotor configured to rotate adjacent to a second rotor is disclosed. The second rotor includes a circular main body with a first axis of rotation and a vane extending radially from the main body. The first rotor includes a first curved surface that corresponds to a curve swept at a constant radius about a second axis of rotation, a second curved surface that corresponds to a curve swept by a leading edge of the vane when the second rotor is simultaneously rotated about the first axis of rotation and the second axis of rotation, a third curved surface that corresponds to a curve swept by a trailing edge of the vane when the second rotor is simultaneously rotated about the first axis of rotation and the second (Continued)

axis of rotation, and a vane-receiving groove disposed between the second curved surface and the third curved surface.

20 Claims, 12 Drawing Sheets

Related U.S. Application Data continuation-in-part of application No. 13/593,279, filed on Aug. 23, 2012, now Pat. No. 8,956,134.

(51) Int. Cl.
*F04C 2/00* (2006.01)
*F01C 1/12* (2006.01)
*F01C 21/08* (2006.01)
*F04C 27/00* (2006.01)
*F01C 1/20* (2006.01)
*F01C 19/02* (2006.01)

(52) U.S. Cl.
CPC ......... *F04C 27/001* (2013.01); *H05K 999/99* (2013.01); *F01C 19/02* (2013.01); *F04C 2230/60* (2013.01); *F04C 2250/20* (2013.01); *F05B 2230/60* (2013.01); *Y10T 29/49229* (2015.01); *Y10T 29/49336* (2015.01)

(58) Field of Classification Search
CPC ........ F04C 2/18; F04C 27/001; F04C 27/004; F04C 2250/20; F05C 2230/60; F05B 2230/60; Y10T 49/49229; Y10T 49/49336; Y10T 29/49229; Y10T 29/49336
USPC ..................... 418/1, 112–113, 123, 191, 196
See application file for complete search history.

(56) References Cited

U.S. PATENT DOCUMENTS

| | | | |
|---|---|---|---|
| 1,766,519 | A | 7/1927 | Johnson |
| 2,004,563 | A | 6/1935 | Bogoslowsky |
| 2,152,564 | A | 8/1937 | Perkins |
| 2,198,130 | A | 4/1940 | Schweiger |
| 2,571,642 | A | 10/1951 | Yancy |
| 2,690,164 | A | 9/1954 | Skok |
| 2,863,425 | A | 12/1958 | Breelle |
| 2,920,814 | A | 1/1960 | Breelle |
| 3,116,666 | A | 1/1964 | Scott |
| 3,123,012 | A | 3/1964 | Gilreath |
| 3,297,006 | A | 1/1967 | Marshall |
| 3,416,458 | A | 12/1968 | Kopfli |
| 3,621,820 | A | 11/1971 | Newsom |
| 3,846,055 | A | 11/1974 | Brundage |
| 3,941,527 | A | 3/1976 | Allington |
| 4,002,033 | A | 1/1977 | Welch |
| 4,057,035 | A | 11/1977 | Su |
| 4,086,880 | A | 5/1978 | Bates |
| 4,512,302 | A | 4/1985 | Bunce |
| 4,626,182 | A | 12/1986 | Wankel |
| 4,915,600 | A | 4/1990 | Hutchinson |
| 4,971,002 | A | 11/1990 | Le |
| 5,357,923 | A | 10/1994 | Osterburg et al. |
| 5,509,388 | A | 4/1996 | Andres |
| 5,947,713 | A | 9/1999 | Ohman et al. |
| 6,132,197 | A | 10/2000 | Adamovski et al. |
| 6,244,240 | B1 | 6/2001 | Mallen |
| 6,543,406 | B1 | 4/2003 | Pohjola |
| 6,550,443 | B1 | 4/2003 | Vanmoor |
| 7,201,134 | B2 | 4/2007 | Guest et al. |
| 7,467,935 | B2 | 12/2008 | Betz et al. |
| 7,621,116 | B2 | 11/2009 | Rom et al. |
| 7,841,082 | B2 | 11/2010 | Lurtz |
| 2002/0150481 | A1 | 10/2002 | Adamovski et al. |
| 2007/0051087 | A1 | 3/2007 | Rom et al. |
| 2008/0087004 | A1 | 4/2008 | Van Blaricom |
| 2011/0296843 | A1 | 12/2011 | Lawson, Jr. |

OTHER PUBLICATIONS

European Patent Office, Written Opinion of the International Searching Authority for International Application No. PCT/US2013/056083 (counterpart to related U.S. Appl. No. 13/593,279), dated Apr. 17, 2014.

POSITIVE DISPLACEMENT ROTARY DEVICES WITH UNIFORM TOLERANCES

CROSS-REFERENCE TO RELATED APPLICATIONS

This application is a continuation of U.S. patent application Ser. No. 14/595,786, which was filed Jan. 13, 2015, which is a continuation-in-part of U.S. patent application Ser. No. 13/593,279, which was filed Aug. 23, 2012, and is now U.S. Pat. No. 8,956,134.

BACKGROUND OF THE INVENTION

A. Field of the Invention

The present disclosure generally relates to positive displacement rotary devices. The disclosed embodiments relate more specifically to positive displacement rotary devices for generating power at an output shaft and methods for making same.

B. Related Technology

In general, conventional gas turbines have three basic stages 1) compression, 2) combustion, and 3) a power extraction. Energy extracted from a turbine is used to drive a compressor, which compresses air so that it may be mixed with fuel and burned in the combustor. The burnt fuel then exits the combustor through the turbine, which causes the turbine to rotate. The rotation of the turbine drives both the compressor and an output shaft.

Different types of gas turbines are defined by how much energy is extracted from the output shaft. For example, turbojets extract as little energy as possible from the output shaft to drive one or more compressor stages, such that much of the energy may be extracted as jet thrust from the compressed gases exiting the turbine. By contrast, turboshafts extract as much energy as possible from the output shaft to not only drive one or more compressor stages, but also to drive other machinery.

Gas turbines are dynamic devices, rather than positive displacement devices. In other words, the output shaft of a gas turbine moves in reaction to the pressure generated when fluid moving at a high speed is diffused, or slowed down, with the blades of the compressor and the turbine, rather than in reaction to pressure differences created on opposing sides of those blades in a constant volume of fluid. And while positive displacement devices move a nearly fixed volume of fluid per revolution of the output shaft at all speeds, the volume of air that a gas turbine moves must increase with the square of the revolutions of the output shaft. Accordingly, gas turbines are efficient at operating speeds that are well below their design speeds. Paradoxically, those operating speeds are often above a speed that is practical to directly drive other machinery with the output shaft, such that more complicated machinery (e.g., a reduction gear) must be implemented to interface the output shaft of a gas turbine with other machinery.

In operation, gas turbines may be started by driving them with a starter motor. For example, the gas turbine may be driven to a speed where the compressor provides enough air pressure for fuel to be ignited in a combustor. If that speed is too great, however, the turbine may begin to act as a positive displacement fixed vane compressor, which would create a vacuum in the combustor. Combustion requires oxygen to react with fuel, and the greater the vacuum created in the combustor, the fewer oxygen molecules there are that may react with the fuel. Another problem with reduced pressure in the combustor is that compressed gas is hotter than ambient air, while the decompressed air in a vacuum is cooler. Such cooled air provides a worse environment for combustion. The possibility of creating such conditions further limits the operating speed of gas turbines.

Positive displacement devices also have various limitations. For example, internal combustion engines configured as positive displacement devices (e.g. piston engines, Wankle engines, etc.) historically have not provided combustion in a constant volume. Instead, such reciprocating machines confine the charge gas, reduce its volume in a compression cycle, and then extract energy from an output shaft as the volume of the charge gas increases after being combusted in an expansion cycle. That process is highly inefficient due to losses not only from the compression cycle, but also from decreases in temperature during the expansion cycle.

In an effort to increase the power density of the reciprocating engine, hybrids of positive displacement devices and gas turbines have been developed. In a turbocharged reciprocating engine, for example, the reciprocating engine serves as the combustor for the turbine and the only work the turbine does is to drive the compressor that increases the air flow to the reciprocating engine so that it can burn more fuel. And in a supercharged reciprocating engine, the reciprocating engine drives a compressor with shaft power, rather than indirectly with combustion gases and a turbine. Nevertheless, many controls are required to effectively mate a dynamic compressor to a positive displacement device, such as the use of waste gates on turbochargers. Further, the limited operating speeds of dynamic compressors generally prevents their use when they are driven by the output shaft of the reciprocating engine, such as in supercharged reciprocating engines. Instead, less efficient positive displacement compressors generally are used in such applications.

BRIEF SUMMARY

To address the shortcomings of the prior art discussed above and to provide at least the advantages discussed below, the present disclosure is directed to a first rotor that is configured to rotate adjacent to a second rotor. The second rotor includes a circular main body with a first axis of rotation and a vane extending radially from the main body. And the first rotor includes a first curved surface that corresponds to a curve swept at a constant radius about a second axis of rotation, a second curved surface that corresponds to a curve swept by a leading edge of the vane when the second rotor is simultaneously rotated about the first axis of rotation and the second axis of rotation, a third curved surface that corresponds to a curve swept by a trailing edge of the vane when the second rotor is simultaneously rotated about the first axis of rotation and the second axis of rotation, and a vane-receiving groove disposed between the second curved surface and the third curved surface that is configured to receive the vane therein. Those and other objects of the present invention, as well as many of the intended advantages thereof, will become more readily apparent with reference to the following detailed description of the preferred embodiments, taken in conjunction with the accompanying drawings.

BRIEF DESCRIPTION OF THE DRAWINGS

Illustrative aspects of the present invention are described in detail with reference to the following figures, which form part of the disclosure, wherein.

In the foregoing figures, like reference numerals refer to like parts, components, structures, and/or processes.

DETAILED DESCRIPTION

Figure 1:
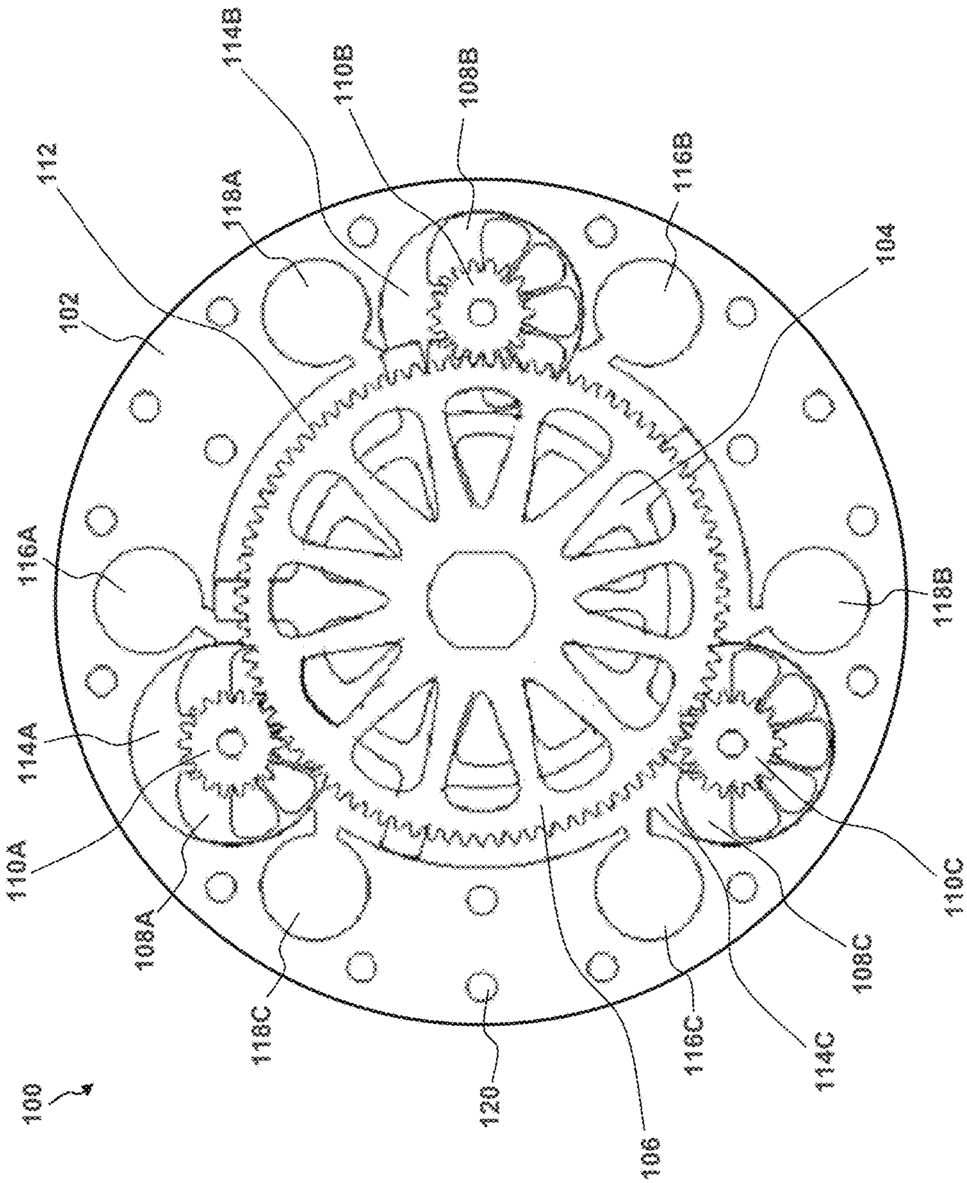
FIG. 1 is a sectional view illustrating a rotary device according to a non-limiting embodiment of the disclosure.

The embodiments of the present disclosure are directed to fixed vane positive displacement rotary devices for generating power at an output shaft and methods for making same. More particularly, the embodiments of the present disclosure are directed to fixed vane positive displacement rotary devices that achieve improved efficiency with non-contact seals that have low levels of leakage. The need for lubrication within the rotary devices is eliminated through the use of those non-contact seals, and the need for additional structure to capture fluid leaking past the vanes is eliminated by scavenging rotors that are configured to maintain close tolerances with a primary rotor and its vanes as the primary rotor and scavenging rotors rotate relative to one another. Those close tolerances are maintained by the shape of scavenging rotors, which is defined by a plurality of intersecting curves that correspond to the multidirectional and intersecting movement of both the scavenging rotor and the vane as the primary rotor and scavenging rotor rotate relative to one another.

Several embodiments of the present invention are described below with respect to the drawings for illustrative purposes, it being understood that the invention may be embodied in other forms not specifically illustrated in the drawings. And in describing the embodiments illustrated in the drawings, specific terminology is resorted to for the sake of clarity. However, the present invention is not intended to be limited to the specific terms so selected, and it is to be understood that each specific term includes all technical equivalents that operate in similar manner to accomplish a similar purpose.

Turning to the drawings, FIG. 1 illustrates a fixed vane positive displacement rotary device 100 according a non-limiting embodiment of the present disclosure. The rotary device 100 comprises a rotor encasement 102, a primary rotor 104, a primary gear 106, a plurality of scavenging rotors 108A-108C, and a plurality of secondary gears 110A-110C. The rotor encasement 102 comprises a circular central opening 112, a plurality of scavenging rotor openings 114A-114C, a plurality of circular intake openings 116A-116C, a plurality of circular exhaust openings 118A-118C, and a plurality of circular voids 120. The plurality of scavenging rotor openings 114A-114C, the plurality of circular intake openings 116A-116C, the plurality of circular exhaust openings 118A-118C, and the plurality of circular voids 120 each are equally spaced from each other around the central opening 112.

Each of the primary rotor 104, primary gear 106, plurality of scavenging rotors 108A-108C, and plurality of secondary gears 110A-110C may be disposed on shafts (not depicted) to facilitate rotation about an axis of rotation defined by the longitudinal axis of each shaft. For example, the primary rotor 104 and the primary gear 106 may be disposed on and rotate about the axis of rotation ($A_{PR}$) of a first shaft, and the plurality of scavenging rotors 108A-108C and the plurality of secondary gears 110A-110C may be disposed on and rotate about the axes of rotation ($A_{SR}$) of a corresponding plurality of second shafts. Each of the shafts may be rotatably disposed in bearings (not depicted), which may be disposed in the rotor encasement 102.

Figure 2:
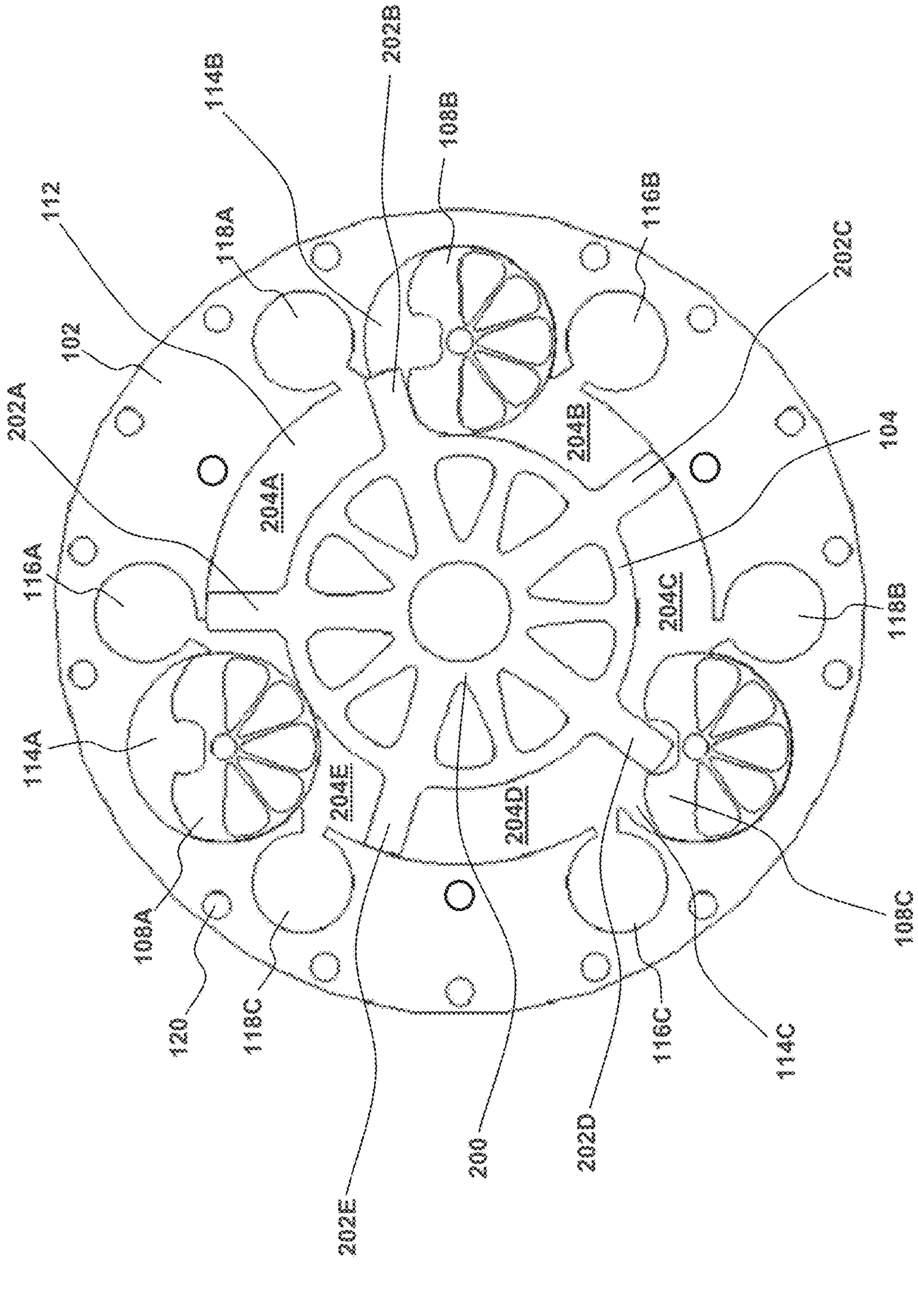
FIG. 2 is another sectional view of the rotary device of FIG. 1 illustrating the rotor encasement, primary rotor, and scavenging rotors of that rotary device.

Ball bearings may be implemented on the rotary device 100 to facilitate high speed rotation of the primary rotor 104, primary gear 106, plurality of scavenging rotors 108A-108C, and plurality of secondary gears 110A-110C. Preferably, sealed ball bearings are implemented for at least the plurality of scavenging rotors 108A-108C and plurality of secondary gears 110A-110C because such bearings provide less axial leakage channels for expanding air to escape, which reduces the pressure differential between vane cells 204A-204E (FIG. 2). Ball bearings also provide axial retention capabilities that prevent the plurality of scavenging rotors 108A-108C from rubbing the walls of the central opening 112 of the rotor encasement 102 by maintaining the axial location of the plurality of scavenging rotors 108A-108C while they are rotating at high speeds. Accordingly, the ball bearings ensure non-contact seals are maintained between in operation. Preferably, the bearings are formed of a rigid material, such as steel, to minimize wear, to maintain axial alignment, and to prevent excessive expansion and contraction due to temperature changes during operation. Alternative configurations and materials also may be implemented, such as cylindrical roller bearings, needle roller bearings, tapered roller bearings, and/or non-contact magnetic bearings.

As illustrated in FIG. 2, the primary rotor 104 comprises a circular main body 200 with a plurality of fixed vanes 202A-202E extending therefrom in a radial direction. The primary rotor 104 is rotatably disposed in the central opening 112 of the rotor encasement 102 such that a plurality of separate trapezoidal vane cells 204A-204E are formed between the main body 200 of the primary rotor 104, the vanes 202A-202E of the primary rotor 104, and the central opening 112 of the rotor encasement 102. Those vane cells 204A-204E vary in volume when the scavenging rotors 108A-108C move through the vane cells 204A-204E as the vanes 202A-202E rotate past them. When the primary rotor 104 rotates in the clockwise direction, for example, the volume of the second vane cell 204B increases as it moves past the second scavenging rotor 108B, and the volume of the third vane cell 204C decreases as it moves toward the third scavenging rotor 108C.

The primary rotor 104 is configured to rotate in response to pressure differences on opposing sides of the vanes 202A-202. Such pressure differences may be caused, for example, by expanding combustion gasses entering the central opening 112 of the rotor encasement 102 via the second intake opening 116B while cooling exhaust gases exit the central opening 112 of the rotor encasement 102 via the second exhaust opening 118B, thereby creating greater pressure in the second vane cell 204B than in the third vane cell 204C. Such pressure differences also may be caused by introducing compressed air (e.g., air already compressed by a compressor) into the central opening 112 of the rotor encasement 102 via the second intake opening 116B and as compressed air that has already expanded exits through the second exhaust opening 118B, thereby creating greater pressure in the second vane cell 204B than in the third vane cell 204C. Accordingly, that pressure differential causes the volume of the second vane cell 204B to increase and the volume of the third vane cell 204C to decrease, thereby causing the primary rotor 104 to rotate in a clockwise direction.

As also illustrated in FIG. 2, the scavenging rotors 108A-108C are rotatably disposed in the plurality of scavenging rotor openings 114A-114C of the rotor encasement 102 so as to rotate in place around the vanes 202A-202D of the primary rotor 104 with close tolerances as the vanes 202A-202D move through the locations of the scavenging rotors 108A-108C. Those close tolerances are configured to prevent leakage between the different vane cells 204A-204E, as well as between adjacent intake and exhaust openings (i.e., 116A and 118C, 116B and 118A, and 116C and 118B), as the vanes 202A-202E move past the scavenging rotors 108A-108C. And those close tolerances are achieved by shaping the both the primary rotor 104 and the scavenging rotors 108A-108C based on a plurality of intersecting curves that correspond to the multidirectional intersecting movement of both the scavenging rotors 108A-108C and the vanes 202A-202C as the scavenging rotors 108A-108C and the vanes 202A-202C move relative to one another.

The intake openings 116A-116C and exhaust openings 118A-118C are positioned immediately adjacent to the scavenging rotor openings 114A-114C on opposing sides thereof to maximize the volume of fluid that can be moved through each of the vane cells 204A-204E and to ensure that reverse pressure is not created at either the intake openings 116A-116C or the exhaust openings 118A-118C as the vanes 202A-202E move toward or away from them. If, for example, the second intake opening 116B and the second exhaust opening 118B were more centrally located more closely to each other in FIG. 2 (i.e., further from the second scavenging rotor opening 114B and the third scavenging rotor opening 114C, respectively), then the vanes 202A-202E would create outward pressure at the second intake opening 116B as they moved away from the second scavenging rotor 108B and toward the second intake opening 116B, and they would create suction at the second exhaust opening 118B as they moved toward the third scavenging rotor 108C and away from the second exhaust opening 118B. Further, the intake openings 116A-116C and exhaust openings 118A-118C are spaced so that the vanes 202A-202E only allow fluid communication between one of those openings 116A-118C and each of the channels 204A-204E at any rotational position.

Figure 3:
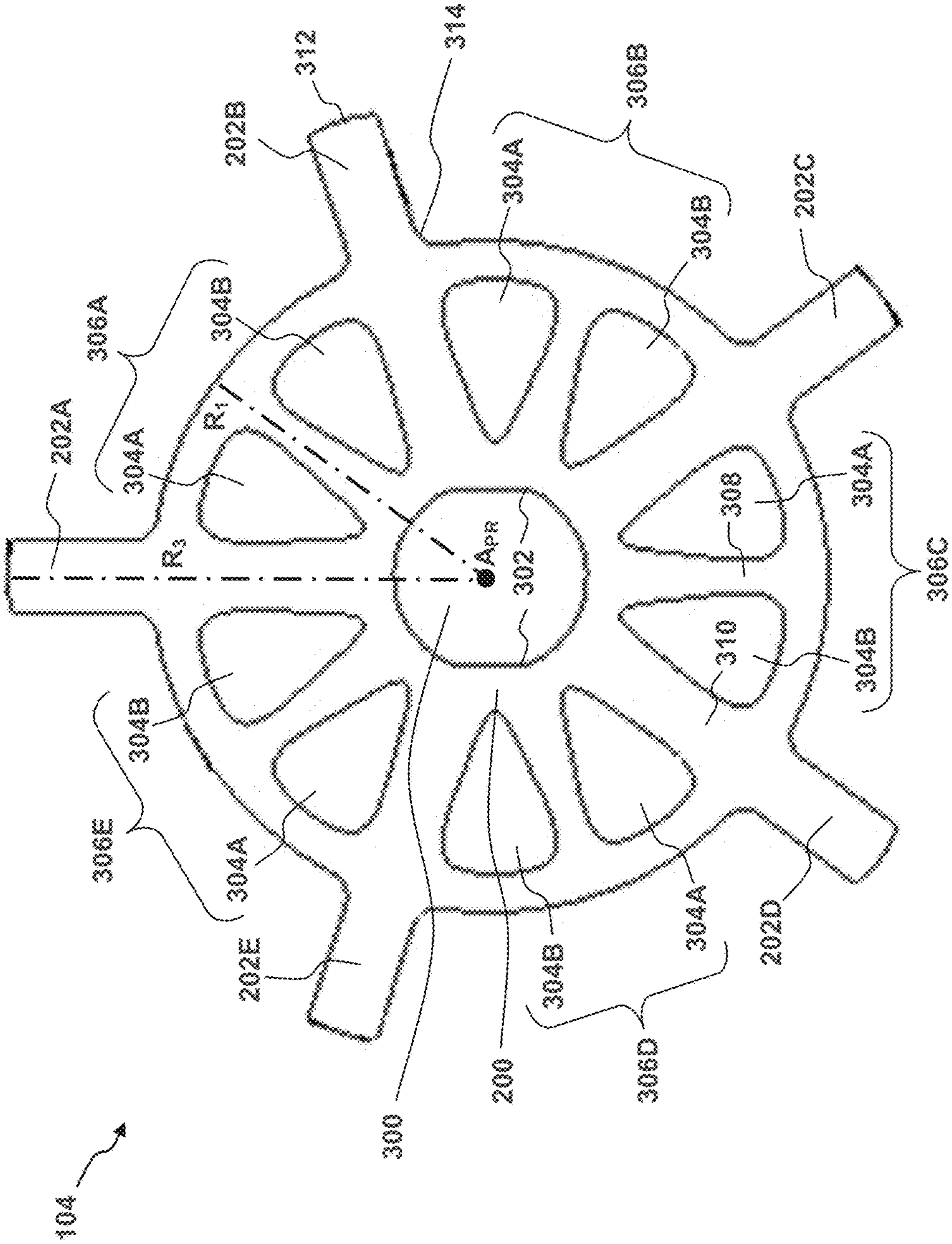
FIG. 3 is a plan view illustrating the primary rotor of FIG. 2.

Turning to FIG. 3, the main body 200 of the primary rotor 104 comprises a central bore 300 with a central axis $A_{PR}$ about which the primary rotor 104 is configured to rotate. The central bore 300 is formed concentrically about the axis of rotation $A_{PR}$ in a partial circle with substantially flat opposing sides 302. The central bore 300 comprises flat sides 302 to prevent rotation of the output shaft 710 (FIG. 7) within the central bore 300 when the output shaft 710 is being driven by the primary rotor 104. And those flat sides 302 are opposite each other to maintain an equal mass distribution on opposing sides of the axis of rotation $A_{PR}$ so as to prevent vibration when the primary rotor 104 rotates at high speeds. The vanes 202A-202E are equally spaced apart around the circumference of the main body 200 of the primary rotor 104 for similar reasons.

The main body 200 of the primary rotor 104 also comprises a plurality of teardrop shaped voids 304A and 304B disposed around the central bore 300. Although those voids 304A and 304B are positioned circumferentially around the central bore 300 in a configuration that maintains equal mass distribution about the axis of rotation $A_{PR}$, they are not equally spaced from another. Instead, the voids 304A and 304B are alternately spaced around so as to form a plurality of void pairs 306A-306E, such that a first spoke 308 is formed between the adjacent voids 304A and 304B in each of those void pairs 306A-306E and a second spoke 310 is formed between each of the adjacent void pairs 306A-306E. Further, the void pairs 306A-306E are provided in the same numbers as the vanes 202A-202E and are arranged so that the second spoke 310 between each of those void pairs 306A-306E is aligned with one of the vanes 202A, 202B, 202C, 202D, or 202E (referred to hereinafter as vane 202 when generally referring to one of the vanes 202A-202E).

The voids 304A and 304B are provided to reduce the mass, and therefore the moment of inertia, of the primary rotor 104. Each second spoke 310 is thicker in the circumferential direction than each first spoke 308 and is circumferentially aligned with a vane 202 so as to provide additional structural support to the primary rotor 104 that helps prevent the primary rotor 104 from expanding radially near the vanes 202A-202E at high rotational speeds due to the extra mass added by the vanes 202A-202E at those locations. Although the second spoke 308 also provides structural support to the primary rotor 104, it has less thickness than the second spoke 310 to further reduce the mass of the primary rotor 104 in locations that are less likely to expand during high rotational speeds.

Further, although the voids 304A and 304B are describes as having a teardrop shape, it should be understood that the voids 304A and 304B also may be formed in other shapes that achieve similar advantages. Moreover, rather than providing voids 304A and 304B, the primary rotor 104 may be formed utilizing different materials so as to reduce its mass in different locations. For example, the primary rotor 104 could be formed with a lighter material in the locations of the voids 404, or a lighter material could be placed into the voids 404, such as by injecting an aerogel into the voids 404.

The body 200 and vanes 202A-202E of the primary rotor 104 are configured to maintain close tolerances with the inner surface of the rotor encasement 102 and outermost surface 408 (FIG. 4) of the scavenging rotors 108A-108C as the primary rotor 104 rotates in the central opening 112 of the rotor encasement 102. More particularly, the outer surface of the body 200 (i.e., the surface at radius $R_1$) and the outermost surface 408 of the scavenging rotors 108A-108C (i.e., the surface at radius $R_2$) have diameters that result in the outer surface of the body 200 and the outermost surface 408 of the scavenging rotors 108A-108C rotating in close proximity to each other. And the outer surface of the vanes 202A-202E (i.e., the tips 312 of the vanes 202A-202E at radius $R_3$) and the inner surface of the rotor encasement 102 (i.e., the central opening 112) have diameters that result in the outer surface of the vanes 202A-202E moving in close proximity of the inner surface of the rotor encasement 102.

The tips 312 of the vanes 202A-202E, which correspond to the outermost surface of the primary rotor 104, are curved to conform to the curve of the inner diameter of the rotor encasement 102. The curve of the tips 312 have a radius that is less than the radius of the curve of the inner diameter of the rotor encasement 102 to provide additional clearance between the vanes 202A-202E and the inner diameter of the rotor encasement 102 at the outer edges of the tips 312 of the vanes 202A-202E. The close tolerance between those services helps create sonic conditions at the tips 312 of the vanes 202A-202E such that the flow of fluid past the tips 312 of the vanes 202A-202E is significantly limited. Such a condition is known as "choked flow."

The shoulders 314 of the primary rotor 104 where the vanes 202A-202E extend from the outer surface of the main body 200 are curved to conform to the shape of the intersected curves (FIG. 5, 500-504) at the leading and trailing edges (FIGS. 4, 410 and 412) of the scavenging rotors 108A-108C to maintain close tolerances as the scavenging rotors 108A-108C move around the vanes 202A-202E. Those conforming curves are depicted, for example, between second scavenging rotor 108B and the shoulder 314 of the second vane 202B in FIG. 2. Conforming the shoulders 314 of the primary rotor 104 to the shape of the scavenging rotors 108A-108C in that manner prevents pockets from being created between the primary rotor 104 and the scavenging rotors 108A-108C that could carry fluid past the scavenging rotors 108A-108C as the scavenging rotors 108A-108C move around the vanes 202A-202E. Even if the sizes and dimensions of the primary rotor 104 and the scavenging rotors 108A-108C does not permit shaping the shoulders 314 of the primary rotor 104, the shoulders 314 of the primary rotor 104 still may be curved in a suitable manner to reduce stress concentrations and add strength where the vanes 202A-202E extend from the outer surface of the main body 200.

Figure 4:
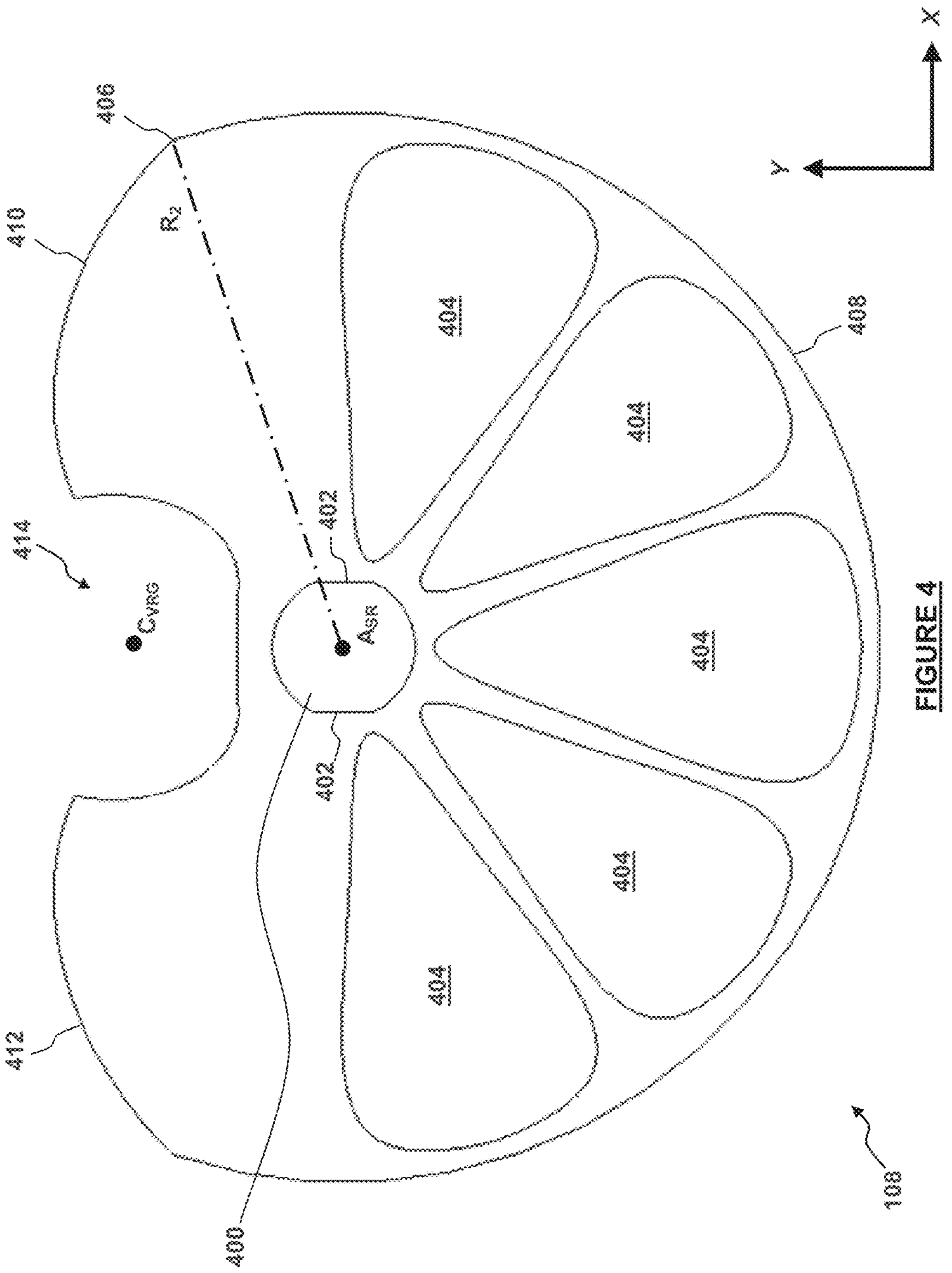
FIG. 4 is a plan view illustrating the scavenging rotor of FIG. 2.

Turning to FIG. 4, each of the scavenging rotors 108A-108C (referred to hereinafter as scavenging rotor 108 when generally referring to one of the scavenging rotors 108A-108C) comprises a central bore 400 with a central axis $A_{SR}$ about which the scavenging rotor 108 is configured to rotate. The central bore 400 is formed concentrically about the axis of rotation $A_{SR}$ in a partial circle with substantially flat opposing sides 402. The central bore 400 comprises flat sides 402 to prevent rotation of the shaft (not shown) that connects the scavenging rotors 108A-108C to their respective secondary gears 110A-110C within the central bore 400 when the secondary gears 110A-110C are driving the scavenging rotors 108A-108C. And those flat sides 402 are opposite each other to maintain an equal mass distribution on opposing sides of the axis of rotation $A_{SR}$ so as to prevent vibration when the scavenging rotor 108 rotates at high speeds.

The scavenging rotor 108 also comprises a plurality of teardrop shaped voids 404 disposed on one side of the axis of rotation $A_{SR}$. Those voids 404 are provided to offset the mass removed from the scavenging rotor 108 on the opposing side of the axis of rotation $A_{SR}$ to maintain an equal mass distribution on opposing sides of the axis of rotation $A_{SR}$ so as to further prevent vibration when the scavenging rotor 108 rotates at high speeds. Moreover, those voids 404 reduce the mass, and therefore the moment of inertia, of the scavenging rotor 108. Material is removed from the side of the scavenging rotor 108 opposite the voids 404 so that the scavenging rotor 108 may move around the vanes 202A-202E without contacting them as the vanes 202A-202E moves past the scavenging rotors 108 and the scavenging rotor 108 rotates. Accordingly, material may be removed from the scavenging rotor 108 in amounts and in locations sufficient to offset the volume of material removed to shape the opposing side of the scavenging rotor 108. And by removing material further from the axis of rotation $A_{SR}$ of the scavenging disc 108 to form the voids 404, less material may be removed to offset the volume of material removed to shape the opposing side of the scavenging rotor 108.

By providing voids 404 to offset the volume of material removed from the opposing side of the scavenging rotor 108, the scavenging rotor 108 is balanced about the x-axis. As depicted in FIG. 4, the scavenging rotor 108 also is balanced about the y-axis because of the bilateral symmetry of the scavenging rotor 108 about the y-axis. The scavenging rotor is therefore balanced about its axis of rotation $A_{SR}$ which, as discussed above, prevents vibration when the scavenging rotor 108 rotates at high speeds.

The voids 404 also may be configured to balance the scavenging rotor 108 about the y-axis when the scavenging rotor 108 is not bilaterally symmetric. For example, the shape of the scavenging rotor 108 that would result for a reciprocating vane rotary device (not depicted) would not be bilaterally symmetric. In that example, the voids 404 may be sized and/or shaped differently on opposing sides of the y-axis to account for differences in the amount of material removed on opposing sides of the y-axis to form the curves of the scavenging rotor. The same is true for a scavenging rotor 108 that is configured to operate with a primary rotor 102 that comprises vanes that are not bilaterally symmetric, such as curved vanes.

Figure 5:
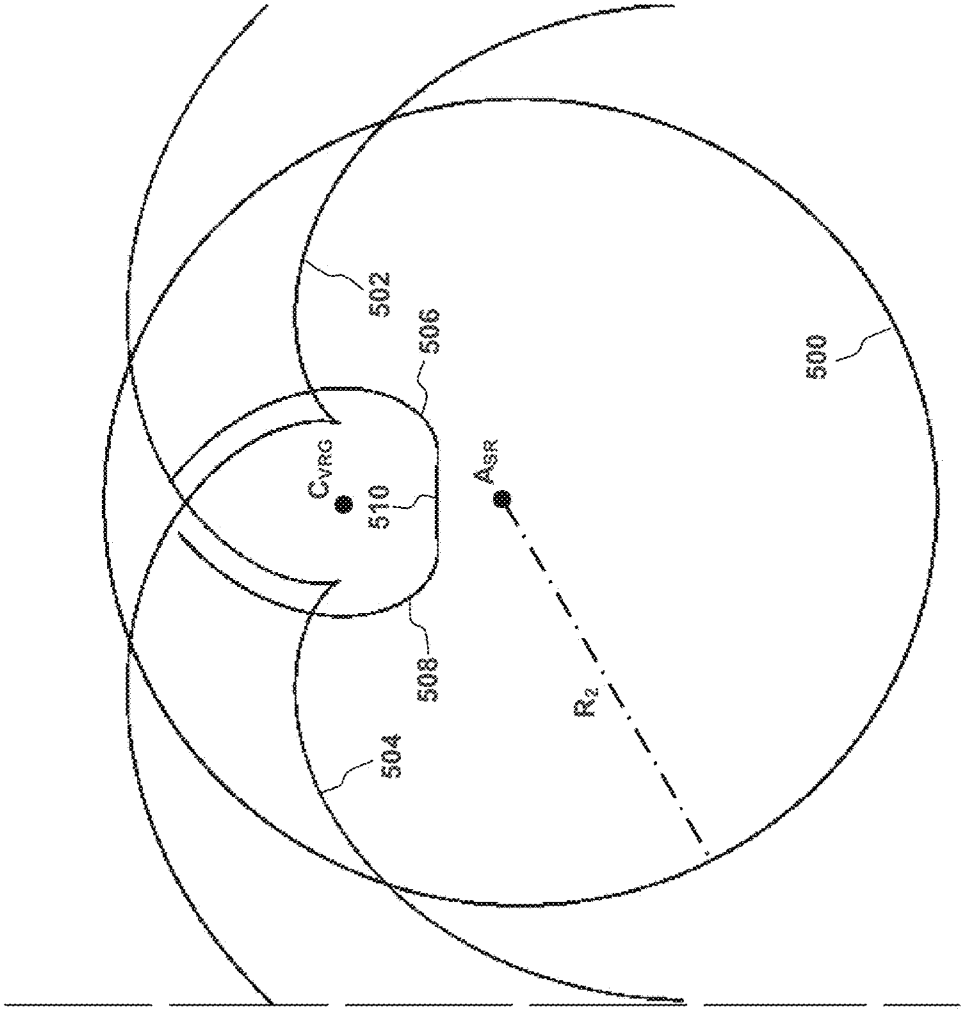
FIG. 5 is a plot illustrating the curves that are used form the scavenging rotor of FIG. 4 according to a non-limiting embodiment of the disclosure.

As illustrated in FIG. 5, the shape of each of the scavenging rotor 108 is defined by a plurality of intersecting curves 500-510 that correspond to the multidirectional intersecting movement of both the scavenging rotor 108 and a vane 202 as the scavenging rotor 108 and primary rotor 104 rotate relative to one another. The first curve 500 corresponds to the circumference of a circle defined by the outermost radial point 406 (i.e., radius $R_2$) of the scavenging rotor 108 from its axis of rotation $A_{SR}$ as it rotates around that axis of rotation $A_{SR}$. Accordingly, the first curve 500 forms the outermost surface 408 of the scavenging rotor 108, to which reference is made above. The second curve 502, third curve 504, fourth curve 506, fifth curve 508, and sixth curve 510 correspond to the movement of different portions of a vane 202 as the primary rotor 104 rotates, taken relative to the rotation of the scavenging rotor 108.

The second curve 502, third curve 504, fourth curve 506, fifth curve 508, and sixth curve 510 are generated by determining the multidirectional intersecting movement of a vane 202 from the reference point of the axis of rotation $A_{SR}$ of the scavenging rotor 108. More particularly, both the rotation of the scavenging rotor 108 and the rotation of the vane 202 are taken into consideration to ensure that, as the primary rotor 104 and scavenging rotor 108 rotate, no point on the scavenging rotor 108 rotates through the same point through which a vane 202 rotates at the same point in time. Both of those rotational movements are translated into a set of curves 502-510 by plotting the movement of a vane 202 with respect to the axis of rotation $A_{SR}$ of the scavenging rotor 108 such that the primary rotor 104 appears to be rotating about the axis of rotation $A_{SR}$ of the scavenging rotor 108 as it also rotates about its own axis of rotation $A_{PR}$. The resulting multidirectional movement of a vane 202 is depicted, for example, in FIG. 6.

Figure 6:
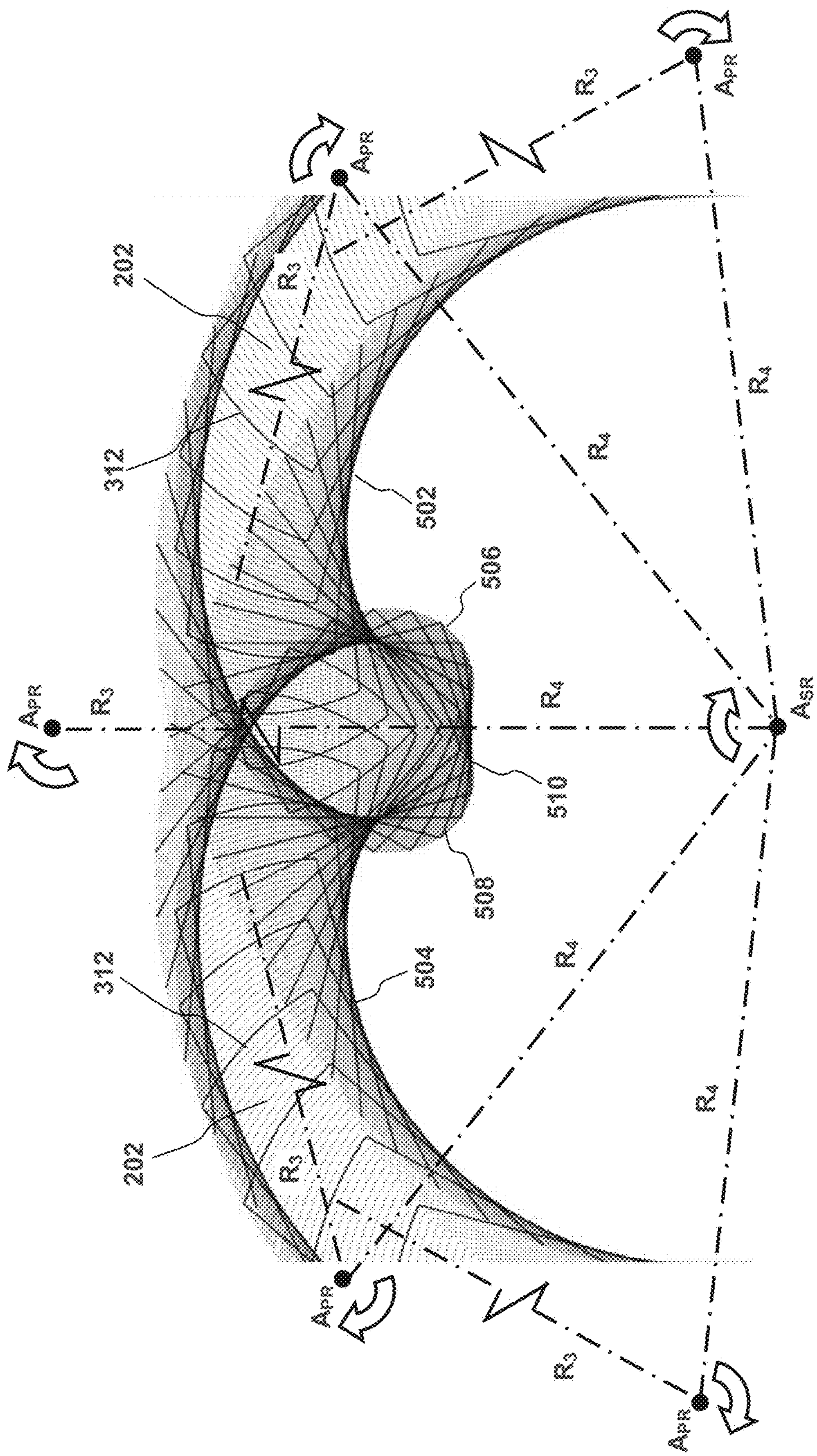
FIG. 6 is a plot illustrating the multidirectional and intersecting movement of both the scavenging rotor of FIG. 4 and a vane of the primary rotor of FIG. 3 that are used to form the curves of FIG. 5 according to a non-limiting embodiment of the disclosure.

As illustrated in FIG. 6, the second curve 502, third curve 504, fourth curve 506, fifth curve 508, a sixth curve 510 are generated by rotating the axis of rotation $A_{PR}$ of the primary rotor 104 about the axis of rotation $A_{SR}$ of the scavenging rotor 108 and simultaneously rotating the silhouette of the vane 202 about the axis of rotation $A_{PR}$ of the primary rotor 104 (i.e., by rotating the primary rotor 104 about radius $R_4$ as the primary rotor 104 rotates about its own axis of rotation $A_{PR}$). Such planetary motion also may be replicated in other manners. For example, the axis of rotation $A_{SR}$ of the scavenging rotor 108 may be rotated about the axis of rotation $A_{PR}$ of the primary rotor 104 while simultaneously rotating the scavenging rotor 108 about its own axis of rotation $A_{SR}$ (i.e., by rotating the primary rotor 104 about radius $R_4$ as the primary rotor 104 rotates about its own axis of rotation $A_{PR}$). Or such planetary motion may be replicated by rotating the scavenging rotor 108 about its own axis of rotation $A_{SR}$ while simultaneously rotating the primary rotor about its own axis of rotation $A_{PR}$. Nevertheless, it should be understood that it is computationally more simple to utilize either the axis of rotation $A_{PR}$ of the primary rotor 104 or the axis of rotation $A_{SR}$ of the scavenging rotor 108 as a point of reference for both rotations.

Those rotations are performed at rotational speeds with the same ratio as the rotational speeds at which the primary rotor 104 and the scavenging rotor 108 rotate relative to one another. If for example, in a configuration with (5) vanes 202A-202E on the primary rotor 104, the primary rotor 104 rotates with a rotational speed that is five (5) times less than the rotational speed of the scavenging rotor 108, such that each vane 202 is rotated about the axis of rotation $A_{PR}$ of the primary rotor 104 at a rotational speed that is five (5) times less than the rotational speed at which the axis of rotation $A_{PR}$ of the primary rotor 104 is rotated about the axis of rotation $A_{SR}$ of the scavenging rotor 108. The resulting curves 502-510 thereby represent the multidirectional intersecting movement of the scavenging rotor 108 and the vane 202 with respect to one another at the appropriate rotational speeds.

As the axis of rotation $A_{PR}$ of the primary rotor 104 is rotated about the axis of rotation $A_{SR}$ of the scavenging rotor 108 and the vane 202 is simultaneously rotated about the axis of rotation $A_{PR}$ of the primary rotor 104, the trailing edge of the vane 202 (i.e., the edge of the vane 202 moving away from the scavenging rotor 108) sweeps the second curve 502, the leading edge of the vane 202 (i.e., the edge of the vane 202 moving toward the scavenging rotor 108) sweeps the third curve 504, the leading outer edge of the tip 312 of the vane 202 sweeps the fourth curve 506, the trailing outer edge of the tip 312 of the vane 202 sweeps the fifth curve 508, and the curved upper surface of the tip 312 of the vane 202 sweeps the fifth curve 510. Because those curves 502-510 are formed with the axis of rotation $A_{SR}$ as the point of reference, they may be superimposed directly over the first curve 500, which has the same axis of rotation $A_{SR}$, as depicted in FIG. 5. The area of the first curve 500 that falls outside of those curves 502-510 then may be subtracted from the first curve to form the shape of the scavenging rotor 108, as depicted in FIG. 4.

It is the area of the first curve 500 that falls outside of those curves 502-510 that is referred to above as being "removed" from the scavenging rotor 108 and offset by the voids 404. Nevertheless, it should be understood that the scavenging rotor 108 need not be formed in the same manner as the curves 500-510 that define it. More specifically, the scavenging rotor 108 need not be formed as a circle with the same diameter as the first curve 500 and subsequently machined or otherwise treated to remove the material that corresponds to the area that falls outside of the second curve 502, third curve 504, fourth curve 506, fifth curve 508, and sixth curve 510. Instead, the scavenging rotor 108 may be machined to its final shape without first forming a circle with the same diameter as the first curve 500 so as to reduce material waste. The scavenging rotor 108 also may be formed in its final shape by any other suitable method, such as casting. The primary rotor 104 may be formed in similar manner to the scavenging rotor 108, including by machining or casting.

It should be understood that the curve-forming operation depicted in FIG. 6 also may be performed for a rotary device with reciprocating vanes. In such a curve-forming operation, an additional degree of motion would be added to account for the movement of the vane 202 toward and away from the scavenging rotor 108 as it moves past the scavenging rotor 108. As set forth above, the resulting scavenger rotor 108 would not be bilaterally symmetric, but it still may be balanced about a central axis or rotation $A_{SR}$ by using voids 404 that are sized and/or shaped differently than one another at different locations (e.g., on opposing sides of the y-axis).

Returning to the fixed-vane embodiment, the second curve 502 and third curve 504 depicted in FIG. 5 form the leading edge 410 (i.e., the edge of the scavenging rotor 108 that moves toward the body 200 of the primary rotor 104) and the trailing edge 412 (i.e., the edge of the scavenging rotor 108 that moves toward the body 200 of the primary rotor 104) of the scavenging rotor 108 depicted in FIG. 4. And the fourth curve 506, fifth curve 508, and sixth curve 510 form a vane-receiving groove 414. The first curve 502 and second curve 504 curve outward away from the axis of rotation $A_{SR}$ of the scavenging rotor 108 so as to open inward toward the axis or rotation $A_{SR}$ of the scavenging rotor 108 in a concave manner; the fourth curve 506 and fifth curve 406 curve outward away from the center of the vane-receiving groove 414 $C_{VRG}$ so as to open inward toward in the center of the vane receiving groove in a concave manner; and the sixth curve 510 curves outward away from the center of the vane-receiving groove 414 $C_{VRG}$ so as to open outward away from the center of the vane-receiving groove 414 $C_{VRG}$ in a concave manner.

The curved shapes of the second curve 502 and third curve 504 form shoulders on opposing sides of the vane-receiving groove 414 that allow the leading edge 410 and trailing edge 412 of the scavenging rotor 108 to maintain close tolerances with the trailing edges and leading edges of the vanes 202A-202E as the scavenging rotor 108 rotates around the vanes 202A-202E. The curved shapes of the third curve 506 and fourth curve 508 form the sides of the vane-receiving groove 414 and allow the sides of the receiving groove to maintain close tolerances with the leading outer edge of the tip 312 of the vanes 202A-202E and the trailing outer edge of the tip 312 of the vanes 202A-202E as the scavenging rotor 108 rotates around the vanes 202A-202E. And the curved shape of the fifth curve 510 forms a dimple at the bottom of the vane-receiving groove 414 that allows the bottom of the vane-receiving groove 414 to maintain close tolerances with the curved upper surface of the tip 312 of the vanes 202A-202E as the scavenging rotor 108 rotates around the vanes 202A-202E. Together, the first curve 502, second curve 504, third curve 506, fourth curve 508, and fifth curve 510 allow the scavenging rotor 108 to maintain close tolerances with the vanes 202A-202E as the scavenging rotor 108 rotates around the vanes 202A-202E. Similarly, the outermost surface 408 of the scavenging rotor 108 maintains close tolerances with the body 200 of the primary rotor 104 as the scavenging rotor 108 rotates adjacent to the portions of the body 200 of the primary rotor 104 in between the vanes 202A-202E.

To provide the correct timing for the scavenging rotors 108A-108C to move around the vanes 202A-202E as the vanes 202A-202E move past the scavenging rotors 108A-108C, the primary gear 106 has more teeth than each of the secondary gears 110A-110C by a factor equivalent to the number of vanes 202A-202E on the primary rotor 104 such that the scavenging rotors 108A-108C make one full revolution for each vane 202A-202E on the primary rotor 104 per revolution of the primary rotor 104. In FIG. 2, for example, there are five (5) vanes 202A-202E, so the gear ratio of the primary gear 106 to each of the secondary gears 110A-110C is 5:1. Thus, each of the scavenging rotors 108A-108C rotates five (5) times for every one (1) rotation of the primary rotor 104. And with each of those five (5) rotations, each of the scavenging rotors 108A-108C moves around one of the vanes 202A-202E.

To provide close tolerances between the scavenging rotors 108A-108C and the vanes 202A-202E, rather than a contact fit, the curve of the tip 312 of the vanes 202A-202E and the leading and trailing edges of the vanes 202A-202E may shifted outward by an appropriate amount so that the size of the silhouette of the vanes 202A-202E that is swept through the scavenging rotors 108A-108C is increased. The enlarged silhouette then may be utilized when calculating the shape of the second curve 502, third curve 504, fourth curve 506, fifth curve 508, and sixth curve 510. In the alternative, the second curve 502, third curve 504, fourth curve 506, fifth curve 508, and sixth curve 510 may be shifted inward in a similar manner. And as yet another alternative, both that outward shift and that inward shift may be performed. For example, to obtain a tolerance of 0.001 inches, the curve of the tip 312 of the vanes 202A-202E and the leading and trailing edges of the vanes 202A-202E may shifted outward 0.0005 inches, and the second curve 502, third curve 504, fourth curve 506, fifth curve 508, and sixth curve 510 may be shifted inward 0.0005 inches.

The close tolerances between the primary rotor 104 and the scavenging rotors 108A-108C provide non-contact interfaces that prevent leakage within the rotary device 100. As described above, those non-contact interfaces operate as a non-contact seals by creating a choked flow condition between the primary rotor 104 and the scavenging rotors 108A-108C. Similarly, the central opening 112 and the plurality of scavenging rotor openings 114A-114C of the rotor encasement 102 are toleranced with respect to the vanes 202A-202E of the primary rotor 104 and the outermost surface 408 of the scavenging rotors 108A-108E to create a choked flow condition between the rotor encasement 102 and the primary rotor 104 and between the rotor encasement 102 and the scavenging rotors 108A-108C.

By utilizing non-contact interfaces to create non-contact seals between the various moving parts of the rotary device 100, the compressor can operate more efficiently with less frictional loses, which eliminates the need for lubricants and allows the rotary device 100 to operate at higher temperatures than compressors that utilize oil-based lubricants and/or contact seals. The rotary device 100 also may operate without rollers at the tips 312 of the vanes 202A-202E and without wet or dry lubrication. Moreover, the body 200 of the primary rotor 104 and the outermost surface 408 of the scavenging rotors 108A-108C may be sized irrespective of their surface speeds (i.e., the rate of movement at their respective circumferences) as long as their rotational speeds (i.e., the rate at which they rotate about their central axes $A_{PR}$ and $A_{SR}$) are accounted for when calculating the shape of the second curve 502, third curve 504, fourth curve 506, fifth curve 508, and sixth curve 510.

In FIG. 2, for example, the primary rotor 104 rotates with a rotational speed that is five (5) times less than the rotational speed of the scavenging rotors 108A-108C. Nevertheless, the radius of the main body 200 of the primary rotor 104 (i.e., radius $R_1$) need not be five (5) times greater than the radius of the outermost surface 408 of the scavenging rotors 108A-108C (i.e., radius $R_2$) in order to maintain the same surface speed because there is not contact between the outer surfaces of those components of the rotary device 100. Instead, by utilizing the foregoing method to define the shape of the scavenging rotors 108A-108C so that they move around the vanes 202A-202E, the radius of the outer surface 408 of the scavenging rotors 108A-108C may be selected independently of the radius of the main body 200 of the primary rotor 104, and vice versa, thereby allowing for flexibility of design of the rotary device 100, such as the volume of the working area between the scavenging rotors 108A-108C. The rotary device 100 also allows for flexibility of design in terms of the number of scavenging rotors 108A-108*n*, and therefore working areas, are provided in the rotary device 100.

Returning to FIG. 2, there are three (3) working areas defined between the three (3) scavenging rotors 108A-108C. The first working area is defined by the area in the central opening 112 of the rotor encasement 102 between the primary rotor 104, the first scavenging rotor 108A, and the second scavenging rotor 108B and comprises the first intake opening 116A and the first exhaust opening 118A; the second working area is defined by the area in the central opening 112 of the rotor encasement 102 between the primary rotor 104, the second scavenging rotor 108B, and the third scavenging rotor 108C and comprises the second intake opening 116B and the second exhaust opening 118B; and the third working area is defined by the area in the central opening 112 of the rotor encasement 102 between the primary rotor 104, the third scavenging rotor 108C, and the first scavenging rotor 108A and comprises the third intake opening 116C and the third exhaust opening 118C. Each of those working areas may be utilized as either a fixed-vane compressor or a fixed-vane expander.

Figure 7:
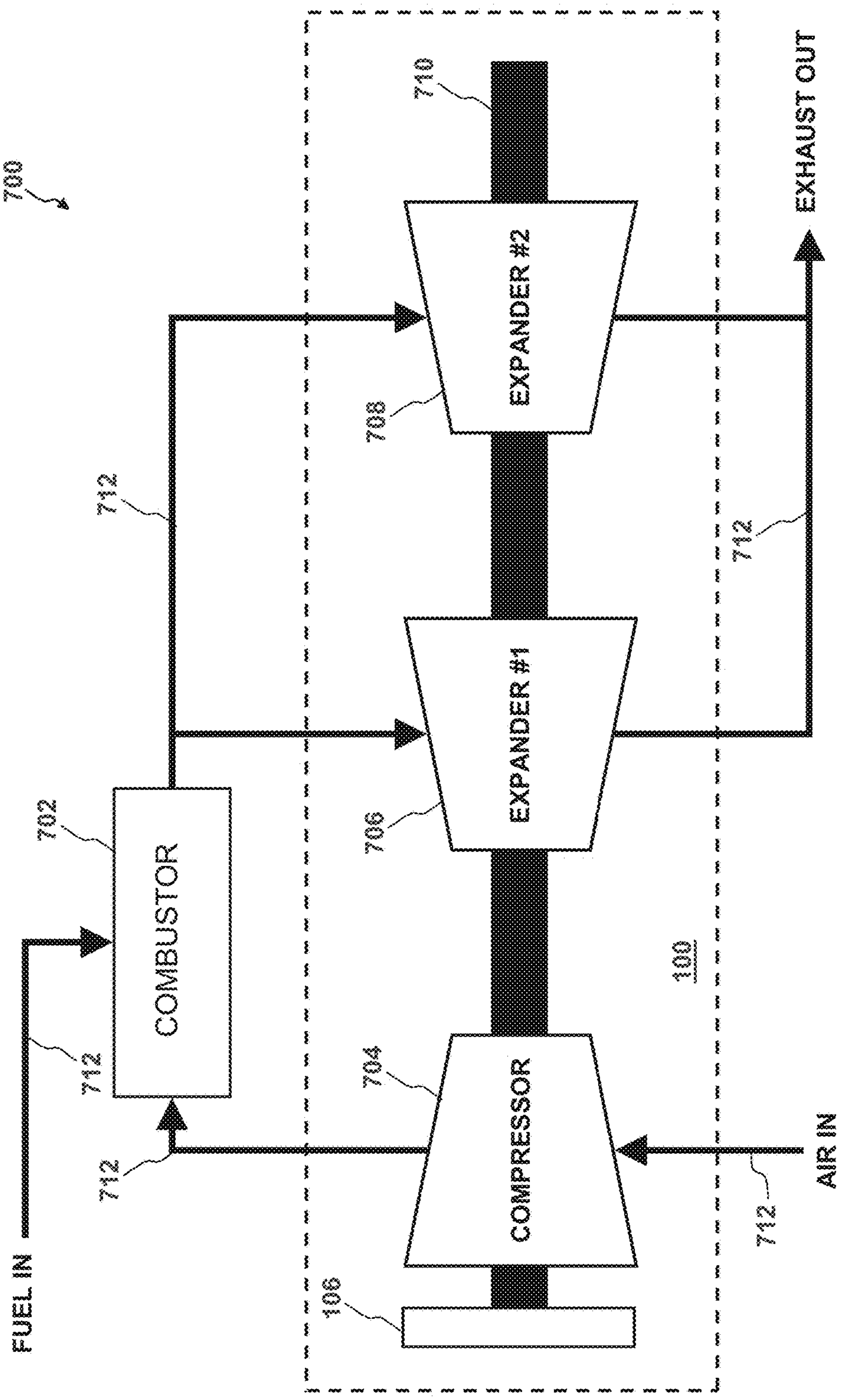
FIG. 7 is a schematic diagram illustrating a Brayton-cycle engine that utilizes the rotary device of FIG. 1 according to a non-limiting embodiment of the disclosure.

Turning to FIG. 7, an example of how the three (3) working areas of the rotary device 100 of FIG. 1 may be utilized in an Brayton-cycle engine 700 is illustrated. The engine 700 comprises the rotary device 100 and a combustor 702. The combustor 702 comprises various components to facilitate the combustion of fuel in the presence of air, such as provisions for fuel injection and ignition. The rotary device 100 is configured to extract energy from substantially any type of expanding fluid. Accordingly, the combustor 702 may be configured to combust substantially any type of fuel.

In the rotary device 100, the first working area is utilized as a fixed-vane compressor 704, the second working area is utilized as a first fixed-vane expander 706, and the third working area is utilized as a second fixed-vane expander 708. The compressor 704, first expander 706, and second expander 708 share the same output shaft 710 by virtue of the first working area, second working area, and third working area each being configured to generate positive displacement via the same primary rotor 104, which is attached to the output shaft 710. The primary gear 106 also is attached to the output shaft 710.

The combustor 702, the compressor 704, the first expander 706, and the second expander 708 are in fluid communication with each other via piping 712 such that fuel and air may be input into the engine 700 upstream of the combustor 702 and the compressor 704, respectively, and exhaust may be output from the engine 700 downstream of the first expander 706 and the second expander 708. That piping 712 may comprise, for example, tubes attached to ports in the rotor encasement 102 and/or channels formed in the rotor encasement 102 such that the fluid communication between those components of the rotary device 100 is provided outside of the working areas. As described above, fluid communication between the working areas is substantially prevented by the non-contact seals created by the close tolerances with which the components of the rotary device 100 are manufactured.

The compressor 704 is configured to charge the combustor 702 with air; the combustor 702 is configured to combust fuel and air; and the first expander 706 and the second expander 708 are configured to extract energy from the combusted fuel and air as those hot gases expand. Accordingly, the combustor 702 is disposed downstream of the compressor 704 and upstream of the first expander 706 and the second expander 708. The energy extracted by the first expander 706 and the second expander 708 is used to drive the compressor 704, which compresses the air so that it may be mixed with the fuel and combusted in the combustor 702. Then, as the combusted fuel exits the combustor 702 through the first expander 706 and the second expander 708, it causes the first expander 706 and the second expander 708 to rotate. The rotation of the first expander 706 and the second expander 708 then drives the output shaft 710.

Because the compressor 704, the first expander 706, and the second expander 708 share a common primary rotor 104, the rotation of the primary rotor 104 that is caused by the expansion of hot gases in the first expander 706 and second expander 708 directly drives the compressor 704 via the primary rotor 104, rather than via the output shaft 710. And the engine 700 utilizes more expanders than compressors so that there is greater displacement in the expanders, such that air and fuel move through the engine 700 in the proper direction. Although the embodiments depicted in FIGS. 1-7 comprise one (1) compressor 704 and two (2) expanders 706 and 708, it should be understood that other numbers of compressors and expanders may be utilized to optimize the flow of fuel and air through the engine 700. It also should be understood that those different numbers of compressors and expanders may be obtained by utilizing two or more rotary devices 100, or by modifying the rotary device 100 to include a larger number of working areas (i.e., a larger number of scavenging rotors 108A-108C and vanes 202A-202E). Further, it should be understood that the desired displacement may be obtained by increasing the size of a working area compared to another, rather than providing different numbers of working areas.

The rotation of the primary rotor 104 also drives the output shaft 710, which drives the primary gear 106. The rotation of the primary gear 106 drives the scavenging rotors 108A-108C via the secondary gears 110A-110C. The energy extracted from the combusted fuel is utilized not only to drive the first expander 706 and the second expander 708, it also is utilized to drive other machinery that may be connected to the output shaft 710. Accordingly, the engine 700 is configured to operate similarly to a turboshaft, wherein the first expander 706 and second expander 708 operate similarly to the turbine section of a gas turbine. The first expander 706 and the second expander 708, however, are positive displacement devices, rather than dynamic devices, such that they are not subject to the operational limitations generally associated with gas turbines. In particular, the configuration of the first expander 706 and the second expander 708 allow the rotary device 100 to remain efficient at operating speeds that are similar to the effective speeds of the compressor.

Because the disclosed rotary device 100 may operate as a positive displacement engine, it has a broader speed range than turbines, which are subject to the laws which govern fans. Like a reciprocating engine, the maximum power speed of the disclosed rotary device 100 may be a large multiple of its idle speed. The ability to idle at partial power and low fuel consumption is a distinct advantage that reciprocating engines have over gas turbines in automotive applications.

The compressor 704 also is a positive displacement device, rather than a dynamic device. Thus, the compressor 704 operates similarly to a Roots blower, wherein the backpressure in the rotary device 100, as compared to the atmospheric pressure of the air input from upstream of the compressor 704, allows the compressor 704 to generate a pressure rise in the air as it passes through the compressor 70. Moreover, the compressor 704 also allows the rotary device 100 to remain efficient at operating speeds that are closer to its design speeds due to its positive displacement configuration. The ability of both the compressor 704 and the first expander 706 and second expander 708 to operate efficiently at such high operational speeds is of particular importance in the rotary device 100 because the compressor 704, first expander 706, and second expander 708 share the same primary rotor 104.

In operation, an open Brayton cycle may be performed with the engine 700. Air is pulled into the compressor 704 via piping 712 that places the first intake opening 116A in fluid communication with atmosphere. The compressor 704 outputs the compressed air to the combustor 702 via piping 712 that places the first exhaust opening 118A in fluid communication with an input of the combustor 702. The combustor 702 also is in fluid communication with a fuel source (e.g., a fuel tank) via the piping 712. Fuel is input into the combustor 702 from the fuel source, such as via a fuel injector, and mixed with the compressed air from the compressor 704 before being combusted. Through those interfaces, the compressor 704 is able to facilitate continuous combustion in the combustor 704 at near-constant pressure.

As the combusted fuel expands, it moves into the first expander 706 and the second expander 708 via piping 712 that places an output of the combustor 702 in fluid communication with the second intake opening 116C and second intake opening 116C. That expanding gas moves toward the first expander 706 and the second expander 708, rather than toward the compressor 704, due to the larger displacement of the first expander 706 and the second expander 708 generated by providing a larger number of expanders than compressors. And to prevent uneven distribution of the expanding gases between the first expander 706 and the second expander 708, the piping 712 that places those components in fluid communication with the combustor 702 is of the appropriate sizes and lengths to maintain equivalent flow of those expanding gases through the first expander 706 and the second expander 708. The piping 712 through which those gases area exhausted from the first expander 706 and the second expander 708 also is of the appropriate sizes and lengths to maintain equivalent flow through the first expander 706 and the second expander 708.

The first expander 706 and the second expander 708 extract energy from the expanding gases as those gases move through the first expander 706 and the second expander 708. While some of that energy is utilized to drive the compressor 704 and the primary gear 106, the remaining energy may be utilized to drive machinery attached to the output shaft 710. The configuration of the rotary device 100 allows such energy to be efficiently extracted from the output shaft 710 by utilizing positive displacement devices for both the compressor and the power extraction roles. Moreover, it eliminates the need for lubrications that might limit the operating temperatures of the rotary device.

In addition, although the disclosed embodiments are described above as being used to implement a Brayton cycle to drive other machinery with the rotary device via output shaft 710, they also may be implemented in a reverse Brayton cycle, or Bell Coleman cycle, by driving the rotary device 100 via the output shaft 710. In such an implementation, the combustor 702 may be replaced with an evaporator and cooled fluid may be moved through an evaporator before being returned back to the compressor 704, rather than being exhausted to atmosphere. Such a closed, reverse Brayton cycle may, for example, be utilized to refrigerate air.

Figure 8:
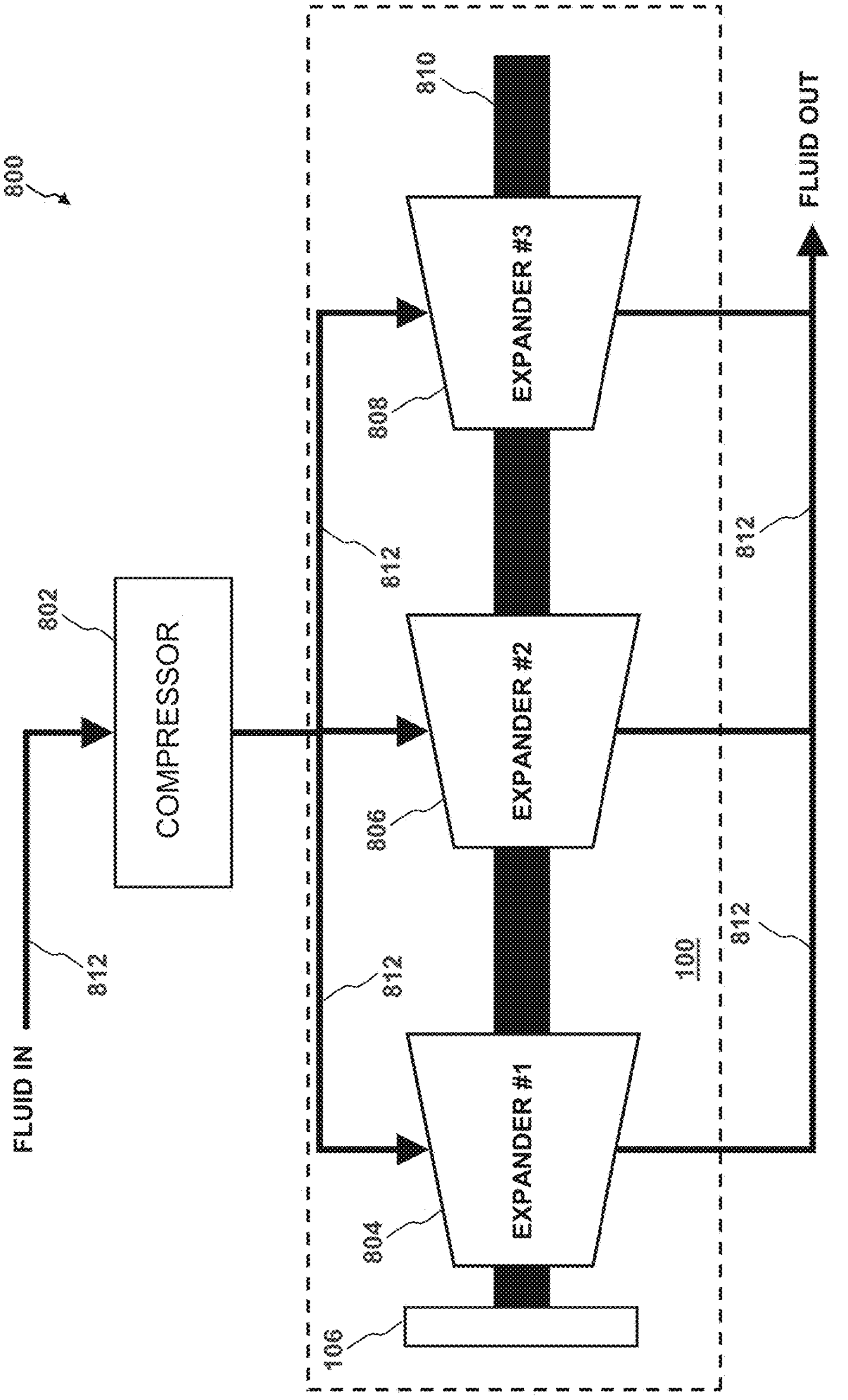
FIG. 8 is a schematic diagram illustrating a fluid motor that utilizes the rotary device of FIG. 1 according to a non-limiting embodiment of the disclosure.

Turning to FIG. 8, an example of how the three (3) working areas of the rotary device 100 of FIG. 1 may be utilized in fluid motor 800 is illustrated. The fluid motor 800 comprises the rotary device 100 and a compressor 802. The compressor 802 comprises various components to facilitate the compression of a fluid, such as air. The rotary device 100 is configured to extract energy from substantially any type of expanding fluid. Accordingly, the compressor 802 may be any type of device that is configured to compress a fluid and/or store a compressed fluid, such as the combustor 702 depicted in FIG. 7 or a high pressure fluid storage tank.

In the fluid motor 800 depicted in FIG. 8, the first working area, the second working area, and the third working area are each utilized as a fixed-vane expanders 804-808, respectively. The first expander 804, second expander 806, and third expander 808 share the same output shaft 810 by virtue of the first working area, second working area, and third working area each being configured to generate positive displacement via the same primary rotor 104, which is attached to the output shaft 810. The primary gear 106 also is attached to the output shaft 810.

The compressor 802, first expander 804, second expander 806, and third expander 808 are in fluid communication with each other via piping 812 such that fluid may be input into the fluid motor 800 upstream of the compressor 802 and output from the fluid motor 800 downstream of the first expander 804, second expander 806, and third expander 808. That piping 812 may comprise, for example, tubes attached to ports in the rotor encasement 102 and/or channels formed in the rotor encasement 102 such that the fluid communication between those components of the rotary device 100 is provided outside of the working areas. As described above, fluid communication between the working areas is substantially prevented by the non-contact seals created by the close tolerances with which the components of the rotary device 100 are manufactured.

Although not depicted in FIG. 8, the piping 812 between the compressor 802 and the first expander 804, second expander 806, and third expander 808 may be provided in the same lengths and diameters so that there is an equivalent flow of fluid being supplied from the compressor 802 to the first expander 804, second expander 806, and third expander 808. Other mechanisms, such as flow control valves and regulators, also may be used to ensure an equivalent flow of fluid. Similar mechanisms also may be used to ensure that an equivalent flow of fluid is output from the first expander 804, second expander 806, and third expander 808.

The compressor 802 is configured to charge the first expander 804, second expander 806, and third expander 808 with compressed fluid; and the first expander 804, second expander 806, and third expander 808 are each configured to allow that compressed fluid to expand and to extract energy from the compressed fluid as it expands. Accordingly, the compressor 802 is disposed downstream of the first expander 804, second expander 806, and third expander 808. The energy extracted by the first expander 804, second expander 806, and third expander 808 drives the output shaft 810, which drives the primary gear 106. The rotation of the primary gear 106 drives the scavenging rotors 108A-108C via the secondary gears 110A-110C. The energy extracted from the compressed fluid may utilized to drive other machinery that may be connected to the output shaft 810.

Although the embodiments depicted in FIGS. 1-6 and 8 comprise three (3) expanders 804-808, it should be understood that other numbers of expanders may be utilized to optimize the flow of fuel and air through the fluid motor 800. It also should be understood that those different numbers of expanders may be obtained by utilizing two or more rotary devices 100, or by modifying the rotary device 100 to include a larger number of working areas (i.e., a larger number of scavenging rotors 108A-108C and vanes 202A-202E). It should be understood that the desired displacement may be obtained by increasing the size of a working area compared to another, rather than providing different numbers of working areas. Further, it should be understood that the compressor 802 depicted in FIG. 8 may be one or more other rotary devices 100.

Figure 9:
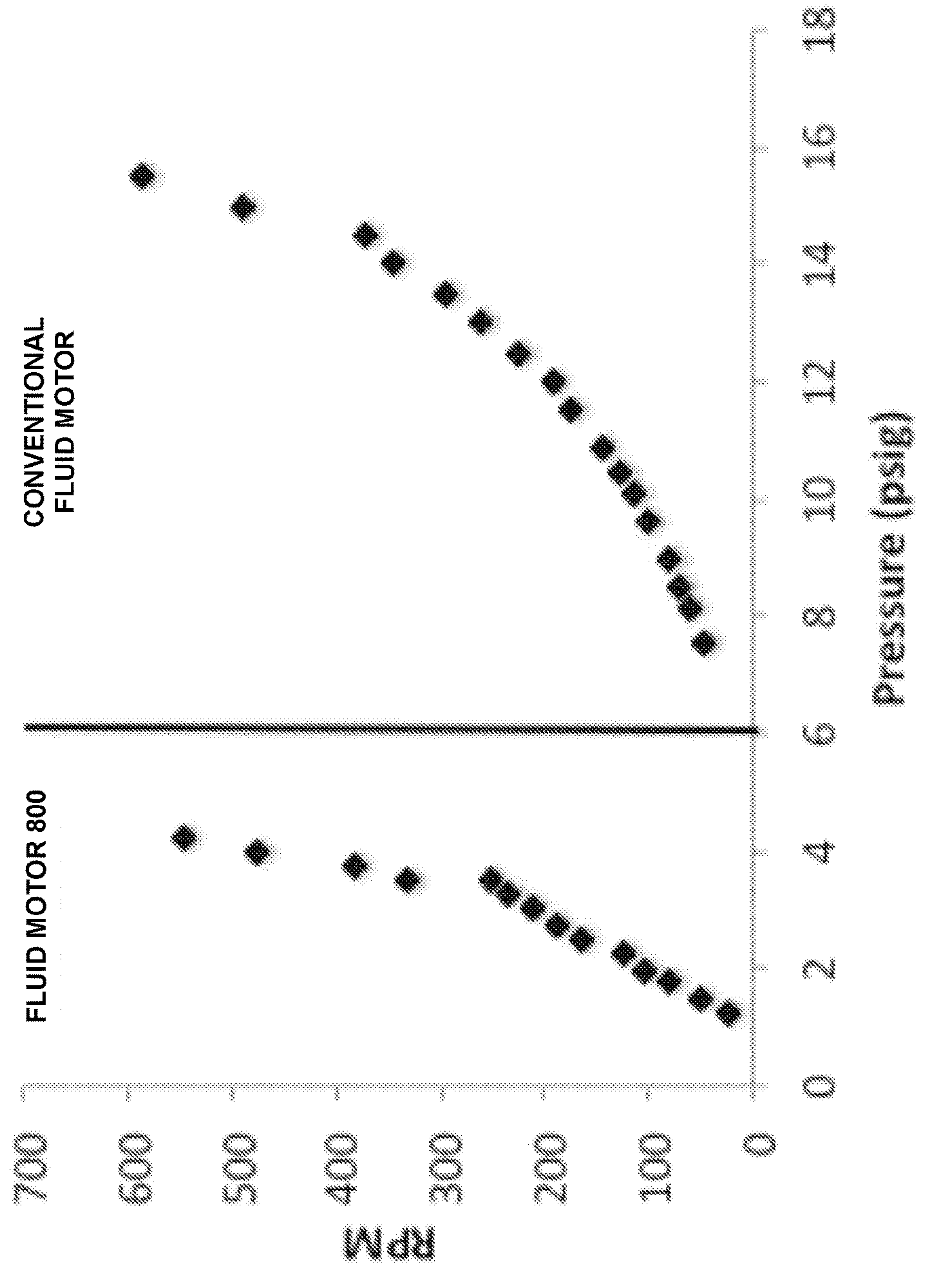
FIG. 9 is a graph illustrating the rotational speed of the rotary device of FIG. 1 at different pressures compared to the rotational speed of a conventional rotary device at the same pressures.
Figure 10:
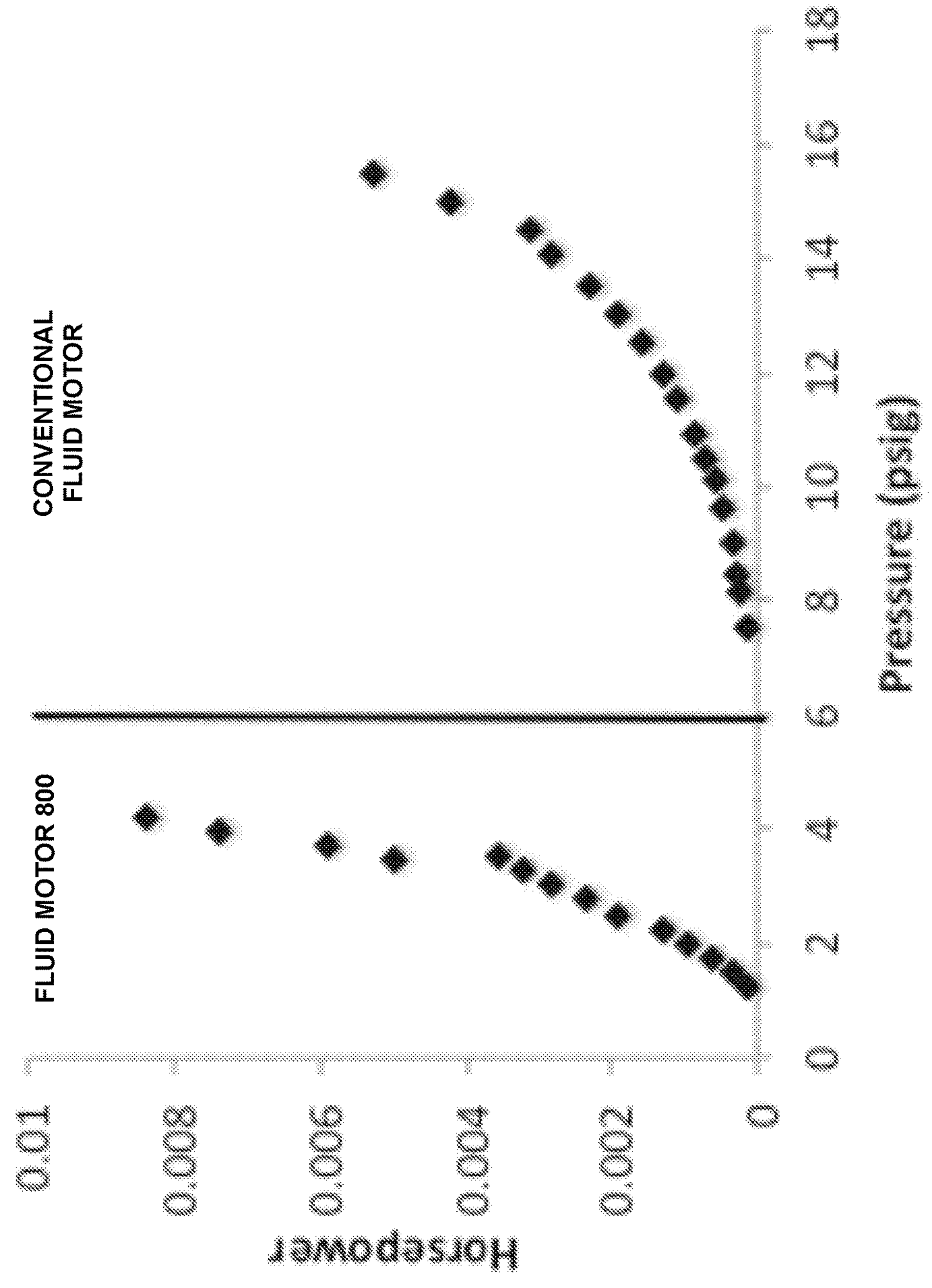
FIG. 10 is a graph illustrating the output horsepower of the rotary device of FIG. 1 at different pressures compared to the output horsepower of a conventional rotary device at the same pressures.
Figure 11:
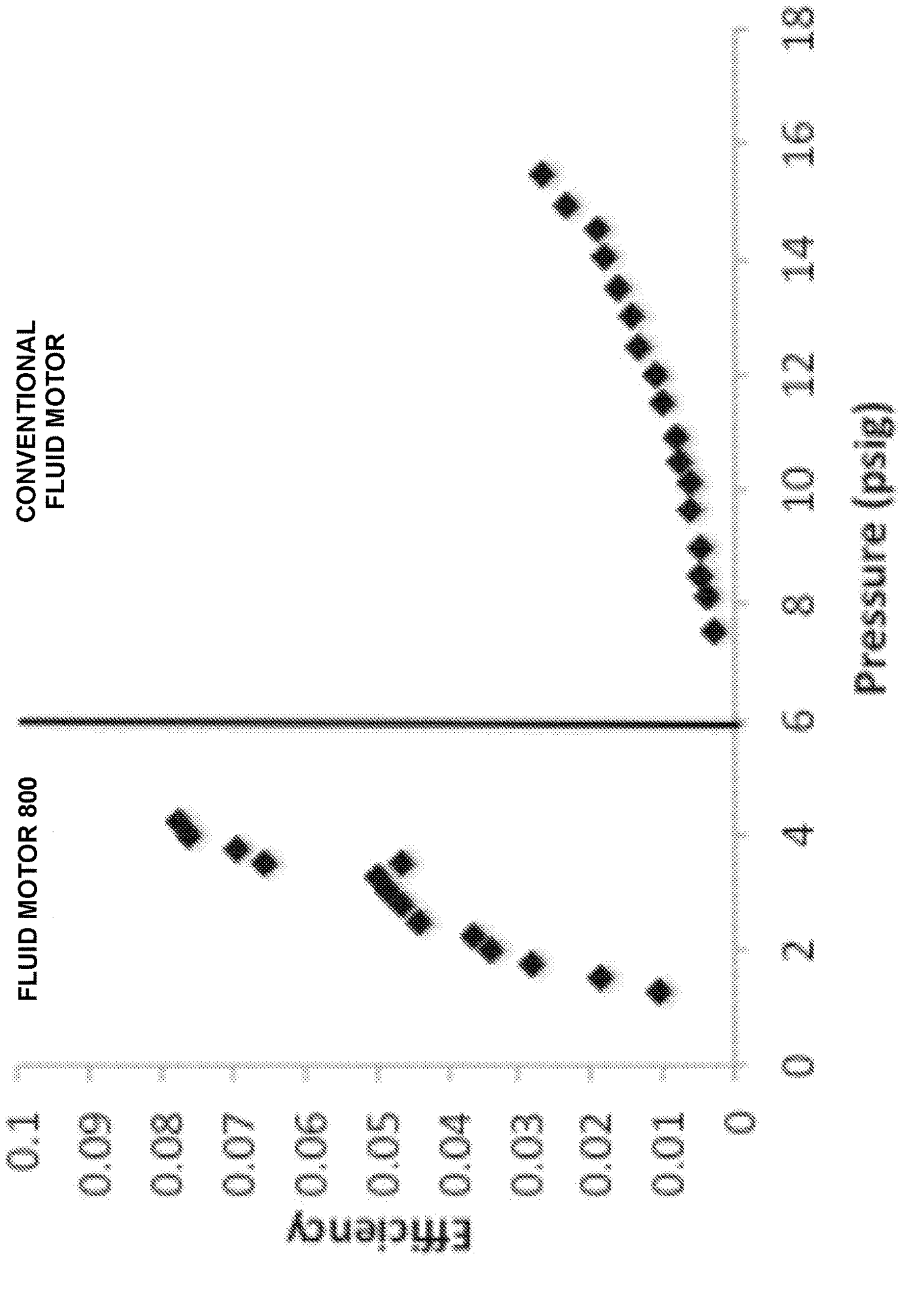
FIG. 11 is a graph illustrating the efficiency of the rotary device of FIG. 1 at different pressures compared to the efficiency of a conventional rotary device at the same pressures.
Figure 12:
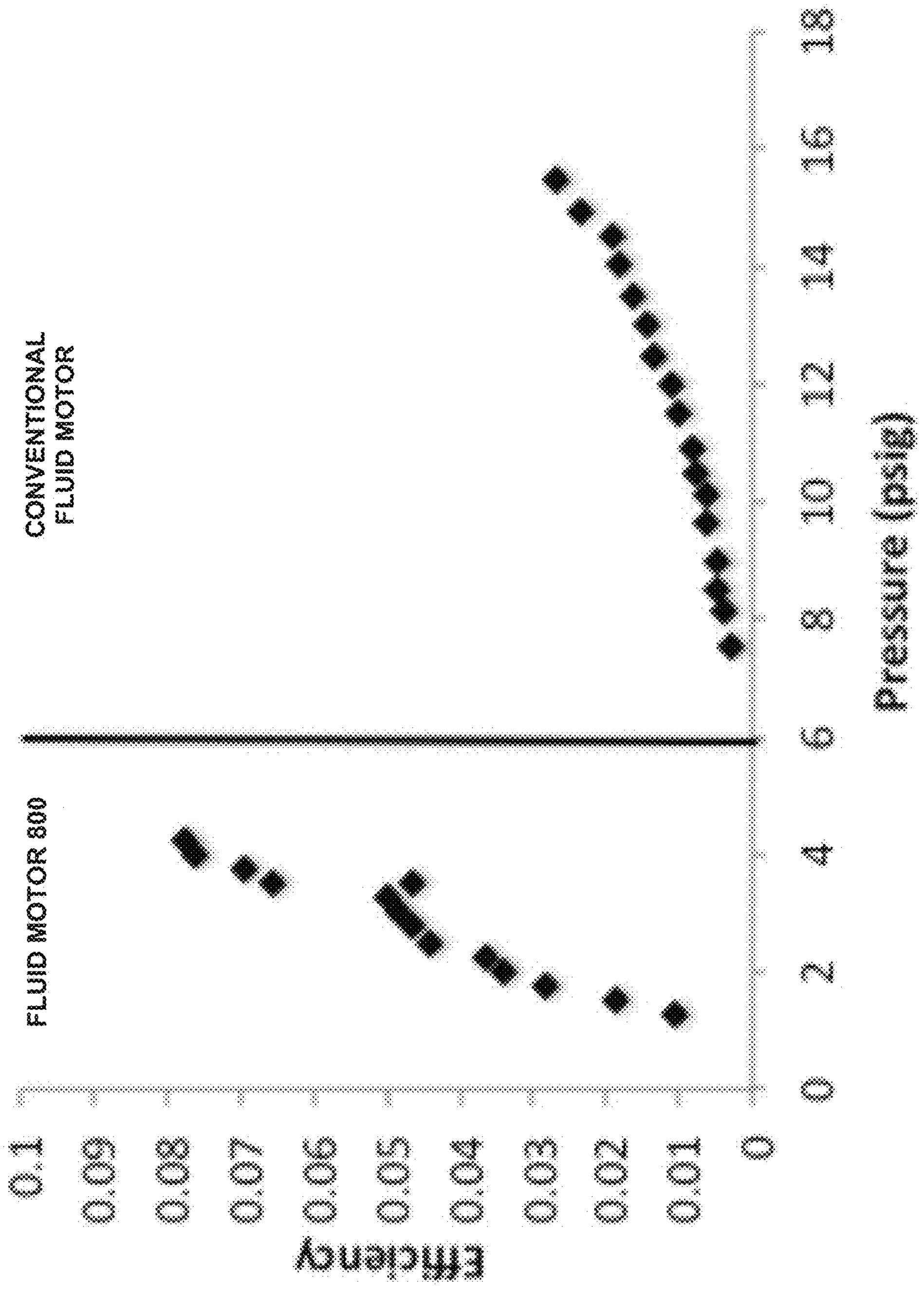

As depicted in FIG. 9, the fluid motor 800 depicted in FIG. 8 has been shown to require less input pressure to require the same rotational speeds (e.g., Rotations Per Minute, or RPM) as conventional fluid motors. The fluid motor 800 depicted in FIG. 8 also has been shown to output more horsepower than a conventional fluid motor at the same rotational speeds and to operate more efficiently than a conventional fluid motor, as depicted in FIGS. 10 and 11, respectively. In FIGS. 9-11, the rotational speeds, output horsepower, and efficiency parameter are plotted as a function of input pressure. To generate the data depicted in FIGS. 9-11, the rotary device 100 of FIGS. 1-6 was compared with a Model NL22 non-lubricated air motor from Gast Manufacturing, Inc. The output shaft of the device being tested (e.g., the output shaft 810 of the rotary device 100) was connected to a torque sensor through a flexible coupling. The output shaft of the torque sensor was connected to another shaft that was set in a brake, which comprised a center positioning vice with silicone foam pads for providing a load to the shaft. The opposite end of that shaft was connected to the shaft of an electric motor to help with leveling and alignment of the shaft in the brake. An optical tachometer was used to measure the rotational speed of the flex coupling at the electric motor using reflective tape.

The flow of fluid from the compressor 802 to the device being tested (e.g., to the first expander 804, second expander 806, and third expander 808) was controlled with a line regulator and a needle valve to produce a range of input pressures and flow rates to the device being tested. The input air flow rate, pressure, and temperature were then measured.

Temperature measurements were also made of the air exiting the device being tested (e.g., air exiting exhaust openings 118A-118C) and of the device housing (e.g., rotor encasement 102).

The tests were conducted by setting the line regulator to a pressure of 25 psig and then slowly opening the needle valve to provide flow to the device under test. The tests were conducted by increasing the input pressure incrementally. For the fluid motor 800 depicted in FIGS. 1-6 and 8, the pressure increments were 0.25 psi. For the conventional air motor, the pressure increments were 0.5 psi because the response of the air motor was found to be significantly less responsive to pressure changes. Data was recorded when the desired flow condition was established.

As depicted in FIG. 9, the rotational speed of the fluid motor 800 depicted in FIGS. 1-6 and 8 increases linearly, with a change in the slope of that line increasing at about 250 RPM but remaining linear after that point. By contrast, the rotational speed of the conventional fluid motor increases parabolicly, with rotational speed increasing at a slower rate at lower pressures.

The horsepower depicted in FIG. 10 was computed from the measurement of torque (in-lb) and RPM using the following equation:

$$HP=T(\text{in-lb})*RPM/63{,}025$$

Both devices produced very low horsepower (e.g., <0.01 HP), but the fluid motor 800 depicted in FIGS. 1-6 and 8 produced significantly more horsepower than the conventional fluid motor (e.g., 0.00837 HP vs. 0.00525 HP) over the same ranges of rotational speeds as the conventional fluid motor.

The efficiency parameter depicted in FIG. 11 is essentially a dimensionless measure of output horsepower relative to input pressure and flow rate. That parameter was computed using the following equation:

$$e=229.17*HP/P(\text{psig})*CFM$$

The factor of 229.17 is used to make the units of the efficiency parameter dimensionless. This particular set of quantities was chosen because the operation characteristics of most fluid motors are given in terms of these quantities. As depicted in FIG. 11, the efficiency of the fluid motor 800 depicted in FIGS. 1-6 and 8 is much higher than the conventional fluid motor, which is at least in part because the input pressure required to obtain output power is much smaller than the conventional fluid motor.

Also observed during the testing of the fluid motor 800 depicted in FIGS. 1-6 and 8 is that the flow rate through the conventional fluid motor was much smaller than that through the fluid motor 800 depicted in FIGS. 1-6 and 8 because flow resistance is lower in the fluid motor 800 depicted in FIGS. 1-6 and 8. Furthermore, the fluid motor 800 depicted in FIGS. 1-6 and 8 was observed to exhibit a temperature decrease, rather than increase, while being operated in the configuration depicted in FIG. 8 as a result of the expansion of fluid in all of the working areas of the rotary device 100. Such a cooling effect may be particularly advantageous when the compressor 802 is configured to combust fuel like the combustor 702 depicted in FIG. 7 because such cooling may reduce the expansion of the various components of the rotary device 100 and, therefore, reduce friction.

The foregoing description and drawings should be considered as illustrative only of the principles of the invention. The invention may be configured in a variety of shapes and sizes and is not intended to be limited by the preferred embodiments. Numerous applications of the invention will readily occur to those skilled in the art. Therefore, it is not desired to limit the invention to the specific examples disclosed or the exact construction and operation shown and described. Rather, all suitable modifications and equivalents may be resorted to, falling within the scope of the invention.

What is claimed is:

1. A first rotor configured to rotate adjacent to a second rotor that comprises a circular main body with a first axis of rotation and a substantially straight vane extending radially from the main body, the vane having a leading edge and a trailing edge when the second rotor rotates in the clockwise direction and the first rotor comprising:

a first curved surface having a constant radius about a second axis of rotation and extending from a second curved surface to a third curved surface of the first rotor, the second axis of rotation being that of the first rotor; and a vane-receiving groove disposed between the second curved surface and the third curved surface that is configured to receive at distal end of the vane therein, wherein the first curved surface is dimensioned to maintain substantially the same distance from the main body of the second rotor when adjacent to the main body of the second rotor, the second curved surface is dimensioned to maintain substantially the same distance from the leading edge of the vane when adjacent to the leading edge of the vane, the third curved surface is dimensioned to maintain substantially the same distance from the trailing edge of the vane when adjacent to the trailing edge of the vane, and the vane-receiving groove is dimensioned to maintain substantially the same distance from the distal end of the vane when the vane is received in the vane-receiving groove.

2. The first rotor of claim 1, wherein the first curved surface and the second curved surface are configured to concurrently form non-contact seals with the main body of the second rotor and the leading edge of the vane, respectively.

3. The first rotor of claim 2, wherein the first curved surface and the third curved surface are configured to concurrently form non-contact seals with the main body of the second rotor and the trailing edge of the vane, respectively.

4. The first rotor of claim 1, wherein the vane-receiving groove comprises:

a fourth curved surface that corresponds to a curve swept by a distal end of the leading edge of the vane when the second rotor is simultaneously rotated about the first axis of rotation and the second axis of rotation; and a fifth curved surface that corresponds to a curve swept by a distal end of the trailing edge of the vane when the second rotor is simultaneously rotated about the first axis of rotation and the second axis of rotation.

5. The first rotor of claim 4, wherein:

the fourth curved surface is dimensioned to maintain substantially the same distance from the distal end of the leading edge of the vane when adjacent to the distal end of the leading edge of the vane, and the fifth curved surface is dimensioned to maintain substantially the same distance from the distal end of the trailing edge of the vane when adjacent to the distal end of the trailing edge of the vane.

6. The first rotor of claim 4, wherein:

the first curved surface is dimensioned to form a non-contact seal with the main body of the second rotor when the first curved surface moves adjacent to the main body of the second rotor;

the second curved surface is dimensioned to form a non-contact seal with the leading edge of the vane when the second curved surface moves adjacent to the leading edge of the vane;

the third curved surface is dimensioned to form a non-contact seal with the trailing edge of the vane when the third curved surface moves adjacent to the trailing edge of the vane;

the fourth curved surface is dimensioned to form a non-contact seal with the distal end of the leading edge of the vane when the fourth curved surface moves adjacent to the distal end of the leading edge of the vane; and the fifth curved surface is dimensioned to form a non-contact seal with the distal end of the trailing edge of the vane when the fifth curved surface moves adjacent to the distal end of the trailing edge of the vane.

7. The first rotor of claim 4, wherein the fourth curved surface and the fifth curved surface are configured to concurrently form non-contact seals with the distal end of the leading edge of the vane and the distal end of the trailing edge of the vane, respectively.

8. The first rotor of claim 4, wherein:

the vane comprises a tip that is curved outward in the radial direction between the distal end of the leading edge and the distal end of the trailing edge; and the vane-receiving groove further comprises a sixth curved surface between the fourth curved surface and the fifth curved surface that corresponds to a curve swept by the tip of the vane when the second rotor is simultaneously rotated about the first axis of rotation and the second axis of rotation.

9. The first rotor of claim 1, wherein the second curved surface and the third curved surface are bilaterally symmetric to each other on opposing sides of the vane-receiving groove.

10. The first rotor of claim 9, wherein the first rotor further comprises a plurality of voids on an opposite side of the second axis of rotation from the second curved surface and the third curved surface, the plurality of voids being configured to balance the first rotor about the second axis of rotation.

11. A method for making a first rotor that is configured to rotate adjacent to a second rotor that comprises a circular main body with a first axis of rotation and a substantially straight vane extending radially from the main body, the vane having a leading edge and a trailing edge when the second rotor rotates in the clockwise direction and the method comprising the steps of:

forming a first curved surface having a constant radius about a second axis of rotation and extending from a second curved surface to a third curved surface of the first rotor, the second axis of rotation being that of the first rotor; and forming a vane-receiving groove disposed between the second curved surface and the third curved surface that is configured to receive a distal end of the vane therein, wherein the first curved surface is dimensioned to maintain substantially the same distance from the main body of the second rotor when adjacent to the main body of the second rotor, the second curved surface is dimensioned to maintain substantially the same distance from the leading edge of the vane when adjacent to the leading edge of the vane, the third curved surface is dimensioned to maintain substantially the same distance from the trailing edge of the vane when adjacent to the trailing edge of the vane, and the vane-receiving groove is dimensioned to maintain substantially the same distance from the distal end of the vane when the vane is received in the vane-receiving groove.

12. The method of claim 11, wherein the first curved surface and the second curved surface are configured to concurrently form non-contact seals with the main body of the second rotor and the leading edge of the vane, respectively.

13. The method of claim 12, wherein the first curved surface and the third curved surface are configured to concurrently form non-contact seals with the main body of the second rotor and the trailing edge of the vane, respectively.

14. The method of claim 11, wherein forming the vane-receiving groove comprises:

forming a fourth curved surface that corresponds to a curve swept by a distal end of the leading edge of the vane when the second rotor is simultaneously rotated about the first axis of rotation and the second axis of rotation; and forming a fifth curved surface that corresponds to a curve swept by a distal end of the trailing edge of the vane when the second rotor is simultaneously rotated about the first axis of rotation and the second axis of rotation.

15. The method of claim 14, wherein:

the fourth curved surface is formed with dimensions that maintain substantially the same distance from the distal end of the leading edge of the vane when the distal end of the leading edge of the vane is adjacent to the fourth curved surface, and the fifth curved surface is formed with dimensions that maintain substantially the same distance from the distal end of the trailing edge of the vane when the distal end of the trailing edge of the vane is adjacent to the fifth curved surface.

16. The method of claim 14, wherein:

the first curved surface is dimensioned to form a non-contact seal with the main body of the second rotor when the first curved surface moves adjacent to the main body of the second rotor;

the second curved surface is dimensioned to form a non-contact seal with the leading edge of the vane when the second curved surface moves adjacent to the leading edge of the vane;

the third curved surface is dimensioned to form a non-contact seal with the trailing edge of the vane when the third curved surface moves adjacent to the trailing edge of the vane;

the fourth curved surface is dimensioned to form a non-contact seal with the distal end of the leading edge of the vane when the fourth curved surface moves adjacent to the distal end of the leading edge of the vane; and the fifth curved surface is dimensioned to form a non-contact seal with the distal end of the trailing edge of the vane when the fifth curved surface moves adjacent to the distal end of the trailing edge of the vane.

17. The method of claim 14, wherein the fourth curved surface and the fifth curved surface are configured to concurrently form non-contact seals with the distal end of the leading edge of the vane and the distal end of the trailing edge of the vane, respectively.

18. The method of claim 14, wherein:
the vane comprises a tip that is curved outward in the radial direction between the distal end of the leading edge and the distal end of the trailing edge; and
forming the vane-receiving groove further comprises forming a sixth curved surface between the fourth curved surface and the fifth curved surface that corresponds to a curve swept by the tip of the vane when the second rotor is simultaneously rotated about the first axis of rotation and the second axis of rotation.

19. The method of claim 11, wherein:
the second curved surface and the third curved surface are formed to be bilaterally symmetric to each other on opposing sides of the vane-receiving groove; and
the method of for making the first rotor further comprises forming a plurality of voids on an opposite side of the second axis of rotation from the second curved surface and the third curved surface, the plurality of voids being configured to balance the first rotor about the second axis of rotation.

20. The method of claim 11, wherein the steps of forming are performed concurrently by a casting process.

* * * * *